(12) United States Patent
Mishima

(10) Patent No.: US 7,230,706 B2
(45) Date of Patent: Jun. 12, 2007

(54) POSITION DETECTION METHOD AND APPARATUS, AND EXPOSURE METHOD AND APPARATUS

(75) Inventor: Kazuhiko Mishima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 41 days.

(21) Appl. No.: 11/102,854

(22) Filed: Apr. 11, 2005

(65) Prior Publication Data

US 2005/0179898 A1 Aug. 18, 2005

Related U.S. Application Data

(62) Division of application No. 10/231,279, filed on Aug. 30, 2002, now Pat. No. 7,019,836.

(30) Foreign Application Priority Data

Sep. 3, 2001 (JP) .............................. 2001-266440

(51) Int. Cl.
| | |
|---|---|
| G01B 11/00 | (2006.01) |
| G01B 9/00 | (2006.01) |
| G03B 27/42 | (2006.01) |
| G03B 27/52 | (2006.01) |
| G01N 21/86 | (2006.01) |

(52) U.S. Cl. ........................ 356/401; 356/124; 355/53; 355/55; 250/548

(58) Field of Classification Search ..................... None
See application file for complete search history.

(56) References Cited

U.S. PATENT DOCUMENTS

| 4,958,160 A | 9/1990 | Ito et al. ..................... 355/53 |
|---|---|---|
| 5,680,200 A | 10/1997 | Sugaya et al. ................. 355/53 |
| 5,754,299 A | 5/1998 | Sugaya et al. ............... 356/401 |
| 5,835,227 A | 11/1998 | Grodnensky et al. ........ 356/399 |
| 5,943,135 A | 8/1999 | Mishima ...................... 356/401 |
| 6,151,121 A | 11/2000 | Mishima ...................... 356/399 |
| 6,163,376 A * | 12/2000 | Nomura et al. .............. 356/401 |
| 6,335,784 B2 | 1/2002 | Mishima ....................... 355/53 |
| 6,396,569 B2 * | 5/2002 | Zheng et al. .................. 355/77 |
| 6,538,740 B1 | 3/2003 | Shiraishi et al. ............. 356/401 |
| 6,664,121 B2 | 12/2003 | Grodnensky et al. ......... 438/16 |

(Continued)

FOREIGN PATENT DOCUMENTS

JP          8-339951          12/1996

(Continued)

OTHER PUBLICATIONS

Japanese Office Action dated Jun. 5, 2006, issued in corresponding Japanese patent application number 2001-266440.

*Primary Examiner*—Gregory J. Toatley, Jr.
*Assistant Examiner*—Gordon J. Stock, Jr.
(74) *Attorney, Agent, or Firm*—Fitzpatrick, Cella, Harper & Scinto

(57) ABSTRACT

A position detection apparatus for detecting a position of an object to be observed, including a position detection system, and an evaluation unit for measuring by the position detection system each of mark spacings between a plurality of alignment marks arranged on the object to be observed and evaluating measurement performance of the position detection system on the basis of mark spacing information obtained as the measurement result.

7 Claims, 25 Drawing Sheets

U.S. PATENT DOCUMENTS

| | | | |
|---|---|---|---|
| 6,850,327 B2 | 2/2005 | Taniguchi et al. | 356/399 |
| 2002/0042664 A1 | 4/2002 | Kikuchi | 700/114 |
| 2002/0165636 A1 | 11/2002 | Hasan | 700/121 |

FOREIGN PATENT DOCUMENTS

| | | |
|---|---|---|
| JP | 9-49781 | 2/1997 |
| JP | 9-250904 | 9/1997 |
| JP | 9-280816 | 10/1997 |
| JP | 2000-121498 | 4/2000 |
| JP | 2001-66111 | 3/2001 |
| WO | WO 99/40613 | 8/1999 |

* cited by examiner

F I G. 1A
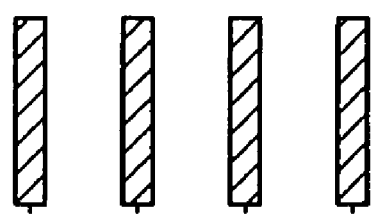
F I G. 1B
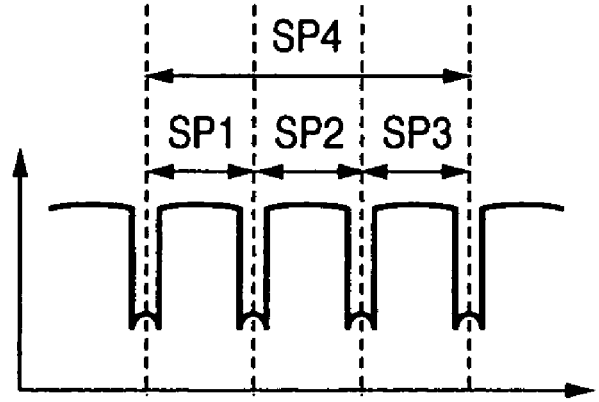

FIG. 2D

F I G. 6A 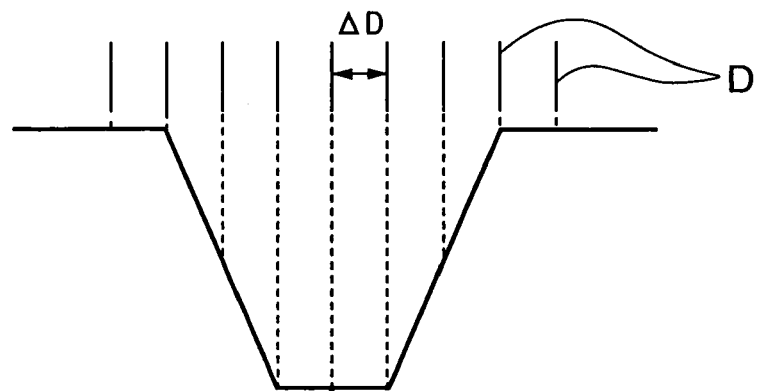
F I G. 6B 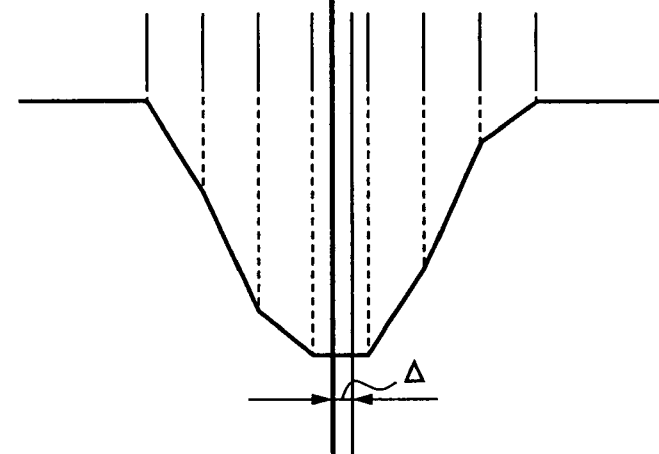
F I G. 6C 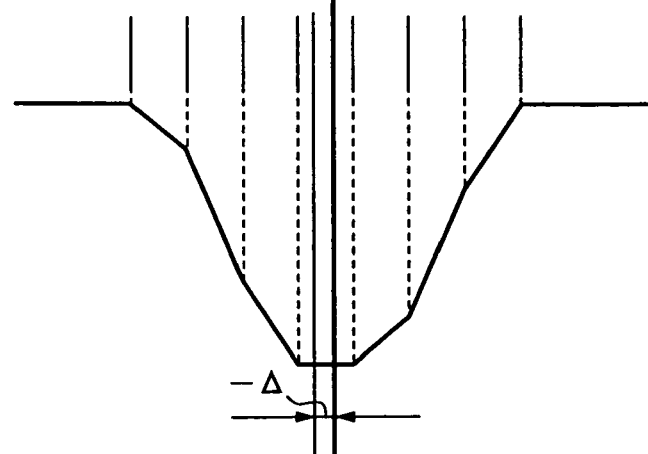

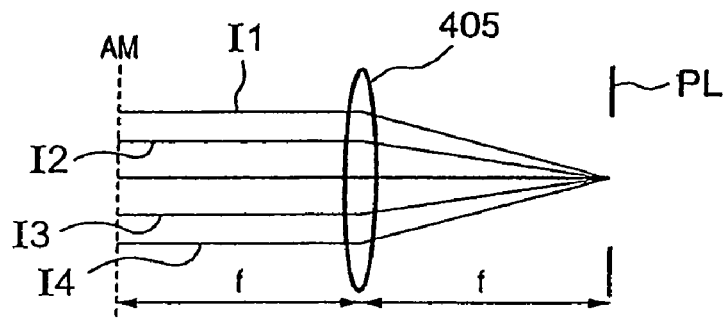
F I G. 19A
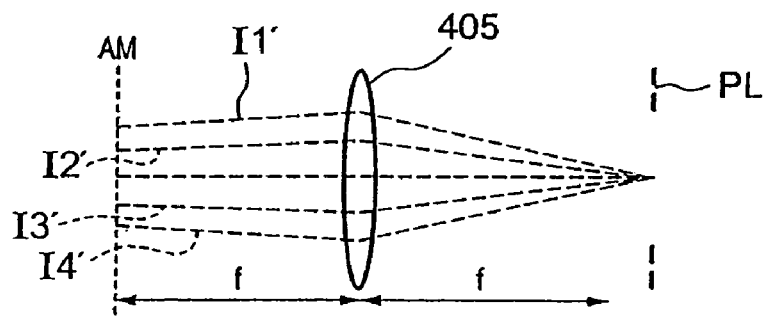
F I G. 19B
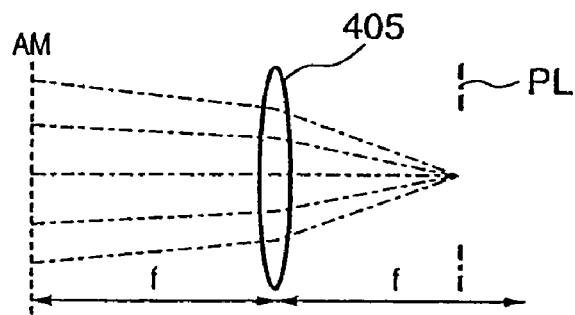
F I G. 19C

FIG. 23

```
URL  http://www.maintain.co.jp/db/input.html

TROUBLE DB INPUT WINDOW

DATE OF OCCURRENCE OF TROUBLE [ 2000/3/15 ]~304
MODEL          [ ********* ]~301
TROUBLE CASE NAME [ OPERATION ERROR (START-UP ERROR) ]~303
SERIAL NUMBER  [ 465NS4580001 ]~302
EMERGENCY LEVEL [ D ]~305

PROBLEM   [ LED KEEPS FLICKERING
            AFTER POWER ON          ]~306

REMEDY    [ POWER ON AGAIN
            (PRESS RED BUTTON IN ACTIVATION) ]~307

PROGRESS  [ INTERIM HAS BEEN DONE   ]~308

(SEND) (RESET)      310              311              312
              LINK TO RESULT LIST DATABASE   SOFTWARE LIBRARY   OPERATION GUIDE
```

POSITION DETECTION METHOD AND APPARATUS, AND EXPOSURE METHOD AND APPARATUS

This application is a divisional application of U.S. patent application Ser. No. 10/231,279, filed Aug. 30, 2002 now U.S. Pat. No. 7,019,836.

FIELD OF THE INVENTION

The present invention relates to a position detection method and apparatus, and an exposure method and apparatus capable of detecting the position of a wafer and aligning the wafer at high precision by observing an image to be detected, which is formed on the wafer, or the like, in manufacturing various devices such as semiconductor ICs, LSIs, CCDs, liquid crystal panels, and magnetic heads.

BACKGROUND OF THE INVENTION

Along with the recent remarkable development of semiconductor element manufacturing techniques, the progress of micropatterning techniques is also prominent. As an optical processing technique, reduction projection exposure apparatuses, generally called steppers, having submicron resolutions, are mainstream. For higher resolutions, a larger numerical aperture (NA) of an optical system and a shorter exposure wavelength are being realized.

As the exposure wavelength decreases, the exposure light source is shifting from high-pressure mercury lamps of g-line and i-line to KrF and ArF excimer lasers.

As the resolution of a projection pattern increases, high precision is also demanded for relative alignment between a wafer and a mask (reticle) in a projection exposure apparatus. The projection exposure apparatus needs to function not only has a high-resolution exposure apparatus, but also as a high-precision position detection apparatus.

For this purpose, high performance is required for a position detection apparatus, also called an alignment scope, for detecting an alignment mark on a wafer, or the like.

As the form of the alignment scope, there are roughly proposed two methods. One form of an alignment scope is a so-called off-axis alignment detection system (Off-Axis Auto Alignment; to be referred to as an "OA" hereinafter), which is separately disposed without the mediacy of a projection exposure optical system and optically detects an alignment mark.

One of the conventional alignment methods using an i-line exposure apparatus is a method of detecting an alignment mark on a wafer by using the alignment wavelength of non-exposure light via a projection optical system called TTL-AA (Through The Lens Auto Alignment).

Currently, in either detection system, a method, in which an image (image data) of an alignment mark to be observed is converted to an electrical signal by a photoelectric conversion element, and the position of the alignment mark is calculated on the basis of the electrical signal, is become mainstream in view of the precision and flexibility of various semiconductor processes.

A projection exposure optical system having a conventional OA detection system will be described with reference to the schematic view in FIG. 4.

Light IL emitted by an exposure illumination optical system 1 including an exposure light source (as the light source, a mercury lamp, a KrF excimer laser, an ArF excimer laser, or the like) illuminates a mask (reticle) 2 having a pattern. At this time, the reticle 2 is aligned in advance by reticle holders 12 and 12' such that an alignment detection system 11 above (or below) the reticle 2 makes the center of the reticle pattern coincide with an optical axis AX of a projection exposure optical system 3.

The light having passed through the reticle pattern transfers the image of the reticle pattern onto a wafer 6 held on a wafer stage 8 at a predetermined magnification via the projection exposure optical system 3. Note that an exposure apparatus for irradiating the reticle 2 with irradiation light from above the reticle 2 and sequentially exposing the wafer 6 to reticle patterns at a fixed position via the projection exposure optical system 3 is called a stepper. An exposure apparatus for relatively driving the reticle 2 and wafer 6 (the driving amount of the reticle 2 is the product of the driving amount of the wafer 6 and a projection magnification) is called a scanner (scanning exposure apparatus).

A kind of wafer 6 is called a second wafer already bearing a pattern. To form the next pattern on this wafer, the position of the wafer must be detected. This position detection method includes the TTL-AA method and OA detection method described above.

An alignment scheme having an OA detection system will be explained based on FIG. 4.

As shown in FIG. 4, an OA detection system 4 is arranged separately from the projection exposure optical system 3. The wafer stage 8 is driven based on an interferometer 9 capable of measuring a lateral distance. The wafer 6 is aligned in the observation region of the OA detection system 4. The OA detection system 4 detects the position of an alignment mark formed on the wafer 6 aligned based on the interferometer 9, thereby obtaining layout information of chips (elements) formed on the wafer 6.

The wafer stage 8 is driven to the exposure region of the projection optical system 3 (transfer region of the reticle) on the basis of the chip (element) layout information. Then, the wafer 6 is sequentially exposed.

A focus detection system 5 for measuring the focus direction of the projection optical system 3 is generally located in the exposure region of the projection exposure optical system 3. In the focus detection system 5, a slit pattern 503 is illuminated via an illumination lens 502 with light emitted by an illumination light source 501. The light having passed through the slit pattern 503 forms a slit pattern on the wafer 6 via an illumination optical system 504 and mirror 505.

The slit pattern projected on the wafer 6 is reflected by the surface of the wafer 65, and enters a mirror 506 and detection optical system 507 arranged on a side opposite to the focus detection system 5. The detection optical system 507 forms the slit image of the wafer 6 on a photoelectric conversion element 508 again. As the wafer 6 vertically moves, the slit image on the photoelectric conversion element 508 moves. From this moving amount, the distance of the wafer 6 in the focus direction can be measured. A plurality of such slits (points on 6 the wafer 6) are prepared, and the focus position of each slit is detected (the points on the wafer 6 are measured). As a result, the inclination of the wafer 6 with respect to the image plane of the reticle image of the projection exposure optical system 3 can be measured.

In the projection exposure apparatus as described above, alignment marks AM formed on an actual process wafer as the wafer 6 have different longitudinal and lateral structures. In addition, an alignment detection system capable of making an illumination condition (to be referred to as an "illumination mode" hereinafter) variable (e.g., wavelength selection and variable NA) is adopted so as to detect these various alignment marks AM at high precision.

Although a description of the TTL-AA method will be omitted, a wafer is basically observed by the OA detection system via the projection exposure optical system 3 in the TTL-AA method. Various alignment marks can be detected while varying the illumination condition.

However, when an alignment mark on a wafer is observed to detect the position by the above-mentioned alignment scope, a resulting alignment detection signal changes, depending on the structures (longitudinal and lateral structures) and type of the alignment mark. Accordingly, optimization of the illumination mode is required to detect such a signal at high precision. For this reason, it is necessary for the device side to select and recommend for the user the optimum alignment structure and illumination mode for various wafer processes.

Conventionally, for these various processes, the optimum illumination mode is selected only in consideration of the contrast of a resulting alignment detection signal waveform. Consequently, in some cases, mismatching between the optimum illumination mode and the final alignment precision may occur.

In addition, when the performance of an alignment scope is to be evaluated, it is judged from its repeatability (e.g., 3σ or range) obtained by continually measuring an alignment mark formed on a wafer stage (including the arrangement on a wafer). However, in this case, the desired performance of an alignment detection system cannot be evaluated satisfactorily due to the influence of the stability/instability of the wafer stage itself (e.g., the stability/instability of an interferometer).

Moreover, linearity (the linearity of measurement values in driving an alignment mark in the measurement direction), one of the characteristics of an alignment detection system, is not regulated, and besides, a shift from the linearity (to be referred to as a "linearity residue" hereinafter) occurs. The cause has not been specified, and a method for adjusting such shift has not been established.

When the measurement precision (linearity) of the position of an alignment mark in the measurement direction degrades, an alignment mark needs to be fed to a predetermined position with respect to the alignment detection system, thereby decreasing the throughput.

SUMMARY OF THE INVENTION

The present invention has been made in consideration of the above problems, and has as its object to provide a position detection method and apparatus, and an exposure method and apparatus capable of evaluating the detection performance in accurately detecting the position of a mark.

According to the present invention, to deal with problems of an alignment detection system as described above, each of mark spacings between a plurality of alignment marks arranged on an object to be observed is measured by an alignment detection system for detecting the position of the object to be observed, and the measurement repeatability of the alignment detection system is evaluated on the basis of the mark spacing information obtained as the measurement result. This makes it possible to accurately evaluate the pure performance of an alignment detection system, which has been impossible due to the influence of the stability/instability of a wafer stage.

The mark spacing information is defined as the repeatability of a mark spacing (to be referred to as "mark spacing repeatability" hereinafter) obtained by continually measuring a mark spacing position at which an alignment mark is stationary or the variation amount of a mark spacing (to be referred to as "mark spacing stability/instability" hereinafter) obtained by measuring a mark spacing at a plurality of positions while driving the alignment mark in the measurement direction.

In addition, by focusing on the mark spacing repeatability and mark spacing stability/instability, the optimum alignment mark and optimum illumination condition (illumination σ, NA, wavelength, and the like) can be selected for an actual process wafer. This can increase the alignment precision in the actual process wafer.

Furthermore, a plurality of alignment marks arranged on the object to be observed are moved by an alignment detection system for detecting the object to be observed in the focus direction relative to the alignment detection system, and mark spacings at a plurality of relative positions are calculated. Besides, a variation amount is calculated on the basis of the mark spacing information at the plurality of relative positions, and the magnification and distortion change (to be referred to as "off-axis telecentricity" hereinafter) of the alignment detection system in a defocused state are adjusted on the basis of the variation amount. With this operation, the linearity precision in measurement of an alignment mark in a defocused state can be improved.

As described above, since evaluation is performed on the basis of mark spacing as an invariable standard, an alignment detection system with a precision higher than a conventional system can be provided.

Additionally, the alignment detection system is applied to a semiconductor exposure apparatus and liquid crystal exposure apparatus, thereby providing a manufacturing method of a device of, e.g., a semiconductor which is capable of detecting the position at high precision.

Employment of a mark spacing, i.e., a measurement value, which is not influenced by the stability/instability of a wafer stage, enables accurate evaluation of the mark detection performance. In addition, measuring the repeatability of a mark spacing and the mark spacing variation in driving a mark enables selection of the optimum alignment mark and illumination mode. Furthermore, by observing the change in mark spacing while defocusing the alignment mark, the off-axis telecentricity can be so adjusted as to be the best while observing the telecentricity of the alignment detection system. With this operation, even if an alignment mark is measured in a defocused state, the linearity in the measurement direction is guaranteed, and position detection at high precision can be achieved.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and therefore reference is made to the claims which follow the description for determining the scope of the invention.

BRIEF DESCRIPTION OF THE DRAWINGS

FIGS. 1A and 1B are schematic views showing measurement of the spacings in an alignment mark and the waveform of a detection signal, respectively.

FIGS. 2A to 2F are schematic views showing the first alignment mark and waveforms of detection signals obtained by changing the illumination mode;

FIGS. 6A to 6C are schematic views showing the waveform of an alignment mark detection signal and the occurrence mechanism of a digital error;

FIGS. 19A to 19C are schematic views each showing a relationship between the object stop PL position and off-axis telecentricity;

FIG. 23 is a particular example of a user interface;

DETAILED DESCRIPTION OF THE PREFERRED EMBODIMENTS

Embodiments of the present invention will be described in detail below with reference to the accompanying drawings.

First Embodiment

Figure 4:
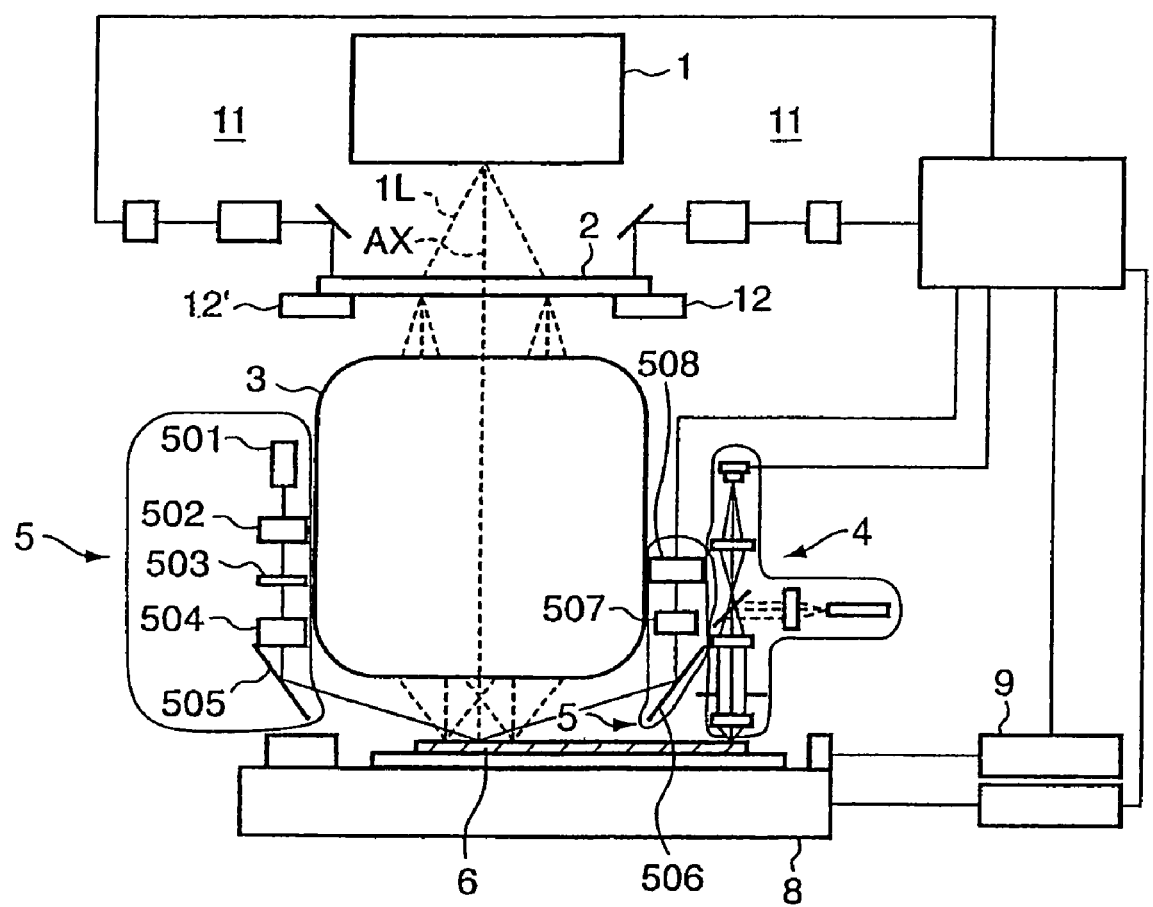
FIG. 4 is a schematic view of a projection exposure apparatus with an alignment detection system.

An OA detection system (alignment detection system) 4 of the projection exposure apparatus shown in FIG. 4 will be described with reference to FIG. 8, which is a detailed view.

Figure 8:
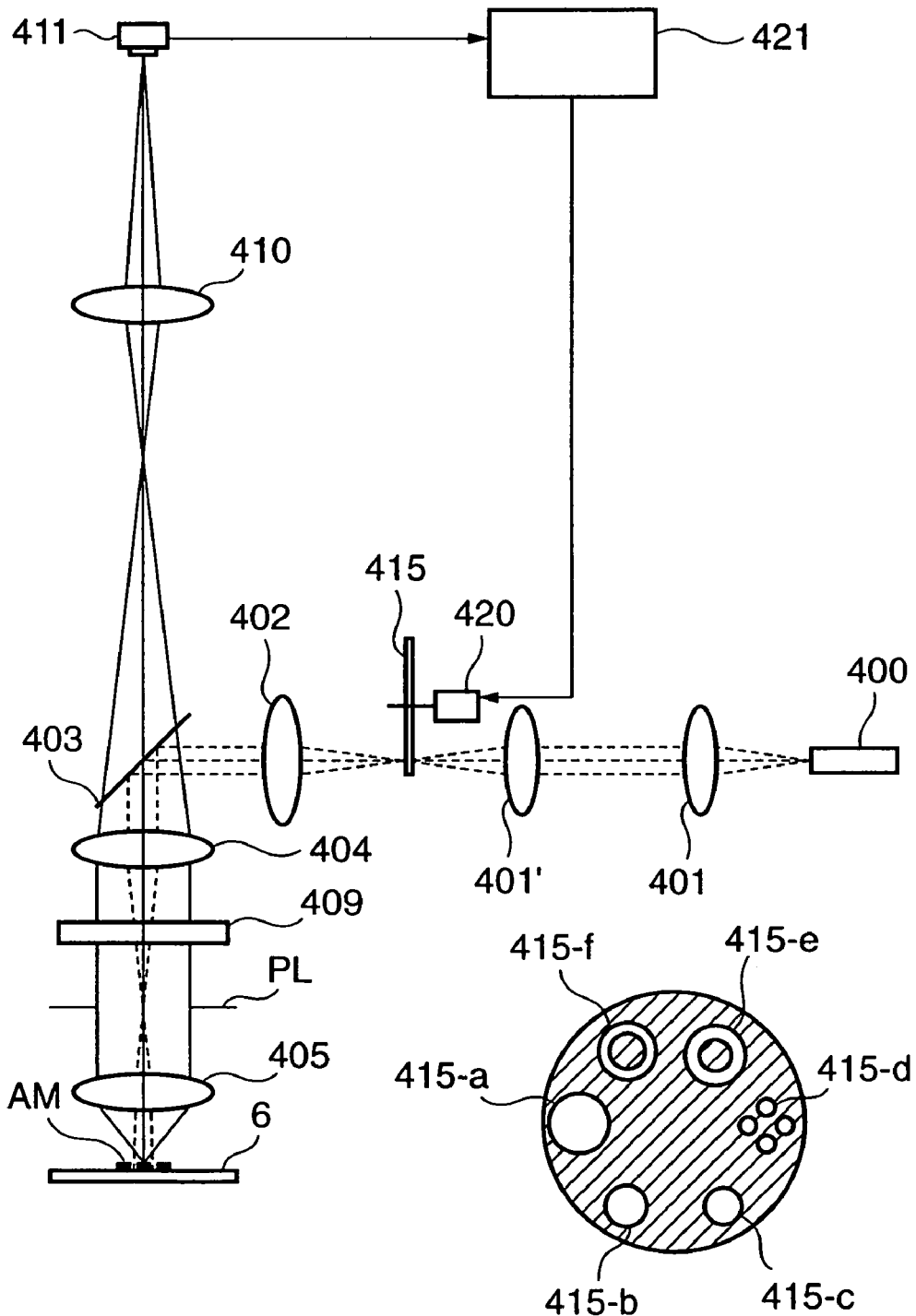
FIG. 8 is a schematic view showing an off-axis alignment detection system.

Referring to FIG. 8, light guided from an illumination light source 400 (e.g., a fiber) passes through illumination relay optical systems 401 and 401'. An image of an end face of the fiber is formed on a rotation aperture stop 415 (to be described later) by the illumination relay system 401 and 401'. Note that the end face of the fiber and the aperture stop 415 are conjugate to the pupil position PL of an objective lens (to be described later). A specific light component of the light having passed through the rotation aperture stop 415 further passes through an illumination optical system 402 and is guided to a polarization beam splitter 403. S-polarized light reflected by the polarization beam splitter 403 in a direction perpendicular to the sheet surface of FIG. 8 passes through a relay lens 404 and λ/4 plate 409. Then, the S-polarized light is converted into circularly polarized light to Köhler-illuminate via an objective lens 405 an alignment mark AM which is formed on a wafer 6.

Reflected light, diffracted light, and scattered light from the alignment mark AM return to the objective lens 405, λ/4 plage 409 and relay lens 404, and are converted into P-polarized light parallel to the sheet surface of FIG. 8. The P-polarized light passes through the polarization beam splitter 403 and forms the image of the alignment mark AM on a photoelectric conversion element 411 (e.g., a CCD camera) via an imaging optical system 410. The position of the wafer 6 is detected on the basis of the position of the image of the photoelectrically converted alignment mark.

At this time, to detect the alignment mark AM on the wafer 6 at high precision, the image of the alignment mark AM must be clearly detected. In other words, the focus of the OA detection system 4 must be adjusted to the alignment mark AM.

For this purpose, an AF detection system (not shown) is generally adopted. The alignment mark is detected by being driven to the best focus plane of the OA detection system on the basis of the detection result of the AF detection system.

Now, the role of the rotation aperture stop 415 will be described in detail. In the plate member of the rotation aperture stop 415 of FIG. 8, a plurality of spatial stops through which a specific light component of light passes are formed. The rotation aperture stop 415 is arranged in a rotation driving system 420. Rotation of the rotation aperture stop 415 in accordance with instructions from a control system 421 makes it possible to swap one of various stop shapes (415-*a* to 415-*f*) with another and insert it into the optical path. Note that, in FIG. 8, hollow portions indicate regions which transmit light, and a hatched region indicates a shading region. The rotation aperture stop 415 may be comprises of a mechanical plate member, or have an arrangement in which a chromium pattern is formed on a glass member. The size of each of the stops 415-*a* to 415-*f* is equal to or less than the size of the object stop PL at the position of the object stop PL. As for the relationship of the fiber end face to each of the stops 415-*a* to 415-*f,* the size of the fiber end face is larger than that of each stop on the rotation aperture stop 415.

Instead of having various shapes, these stops of the rotation aperture stop 415 may have the same shape, and one of them may be comprised of a member in which the light intensity distribution within the plane is uniform, such as a diffusion plate.

With this arrangement, each of the stops 415-*a* to 415-*f* of the rotation aperture stop 415 can be selected, thereby making the so-called illumination σ or deformed illumination for an OA detection system variable. The effect of changing the illumination σ will be described below.

Note that the size of the stop 415-*a* is equal to that of the object stop PL and referred to as σ1. The size of stop 415-*b* (to be referred to as medium σ) is smaller than that of the object stop PL, and the size of the stop 415-*c* (to be referred to as small σ) is further smaller. The stop 415-*d* is formed as quadrupole illumination; the stop 415-*e*, ring illumination 1; and the stop 415-*f*, ring illumination 2. Note that an actual σ (stop shape) is not limited to the above-described arrangement and may have any arrangement optimum for the OA detection system.

In the above arrangement, the illumination light source 400 (fiber) has no mechanism capable of wavelength selection. If a wavelength switching filter (not shown) is provided in the illumination light source 400, the wavelength for the OA detection system can be selected.

The effect of making the wavelength and illumination σ variable will be described further with reference to FIGS. 2A to 2F and FIGS. 3A to 3F.

Figure 2A:
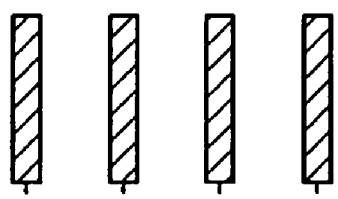
Figure 2B:
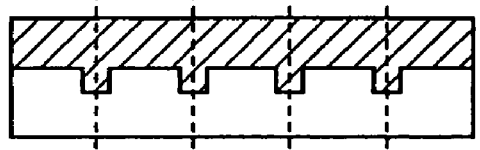
Figure 2C:
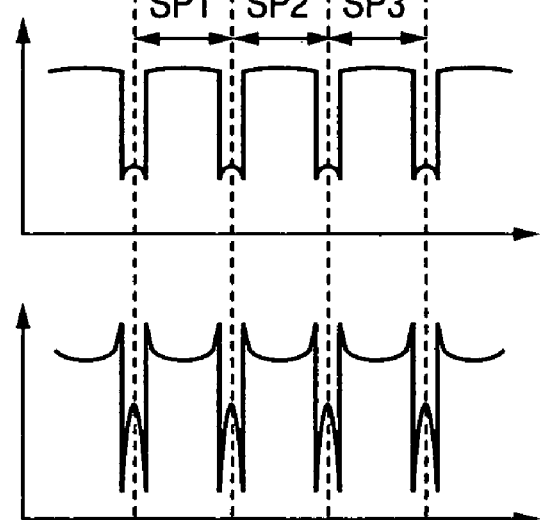
Figure 2E:
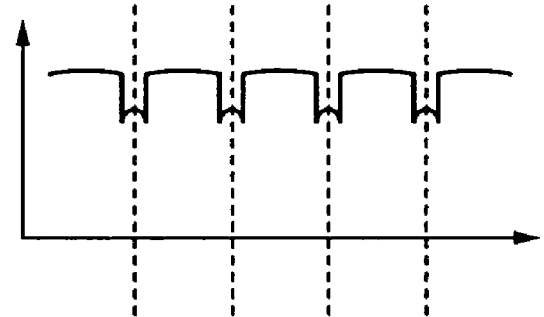
Figure 2F:
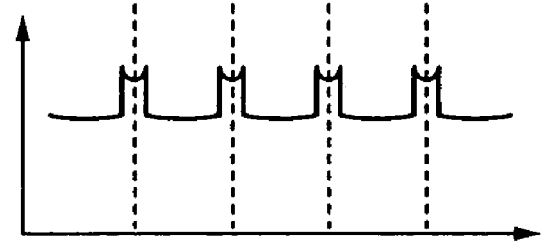
Figure 3A:
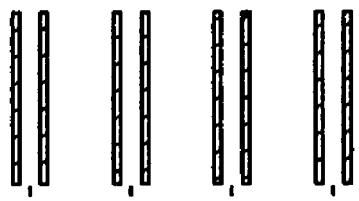
FIGS. 3A to 3F are schematic views showing the second alignment mark and waveforms of detection signals obtained by changing the illumination mode.
Figure 3B:
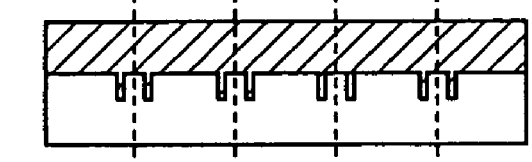

FIGS. 2A and 3A are schematic views of different alignment marks as observed from above. Measurement is performed in the lateral direction of each sheet surface of FIGS. 2A and 2B. FIGS. 2B and 3B show the perspective sectional structures of the alignment marks, and it is assumed that the same multilayer process has been performed for both structures. It is also assumed that each hatched portion indicates a transparent layer for an alignment wavelength. FIGS. 2C to 2F and FIGS. 3C to 3F respectively show alignment mark detection signals which are obtained by changing the illumination σ and wavelength to be used. A combination of an illumination σ and wavelength to be selected will be referred to as "illumination mode" hereinafter.

Figure 3C:
Figure 3D:
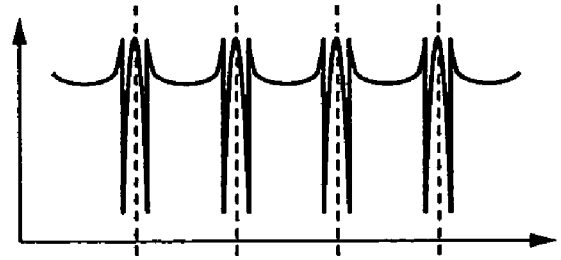
Figure 3E:
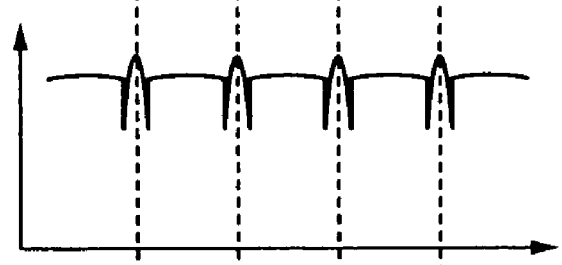
Figure 3F:
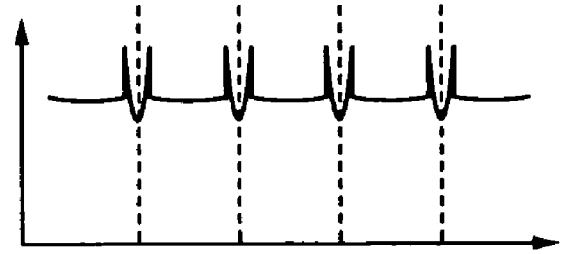

FIGS. 2C and 3C show alignment detection signals as observed with σ1 at the first central wavelength, and FIGS. 2D and 3D show alignment detection signals as observed with small σ at the same wavelength. FIGS. 2E and 3E and FIGS. 2F and 3F show alignment signals observed with σ1 at the second and third central wavelengths, respectively. In this manner, by changing the illumination mode, a detection signal waveform can be changed for a single mark. Additionally, if a mark shape changes in a single illumination mode, a resulting alignment signal waveform will be changed.

Note that the OA detection system is not limited to the arrangement shown in FIG. 8. The present invention is also applicable to, e.g., a detection system in which an illumination system has a different light guide position or a plurality of imaging optical systems 410 and photoelectric conversion elements 411 are provided.

In this example, only an OA detection system, which is arranged separately from a projection optical system, has been described. However, the present invention is not limited to this. In the TTL-AA method for observing a wafer via a projection exposure optical system as well, a similar arrangement can be realized, and the present invention can be applied to the similar arrangement.

Conventionally, to evaluate the performance of an alignment detection system, an alignment mark AM (which can be formed on a wafer) on a wafer stage is continually measured by the alignment detection system, and the obtained measurement repeatability is used. Some of a plurality of types of alignment marks AM of an actual process wafer are selected on the basis of repeatability information obtained by similarly evaluation each alignment mark AM on a wafer stage as the repeatability for the alignment detection system.

However, the measurement repeatability of an alignment mark AM formed on a wafer stage may be influenced by the stability/instability of the position of the stage and may not be available for evaluation of an alignment detection system or alignment signal. This is because the stability/instability of a wafer stage in a stationary state is not generally a very significant element for the actual exposure performance. More particularly, interferometers and the like need to be stable while ships are sequentially exposed (the stage is driven) in actual exposure. Therefore, in a sense, the measurement repeatability of an alignment mark AM is evaluated in a use state different from one which is generally required.

Then, when the measurement repeatability of an alignment mark is evaluated using the repeatability of a mark spacing, the pure performance as an alignment detection system can be evaluated.

A mark spacing is stable unless an alignment mark itself expands or contracts, and it is always constant. Even if an alignment mark expands or contracts, the expansion/contraction is caused by thermal deformation. Thus, a mark spacing does not vary during short measurement, i.e., a plurality of number of times of measurements. In addition, since a mark spacing is about several μm to several tens of μm long, the variation in mark spacing due to thermal expansion/contraction can be neglected.

Therefore, examination of the repeatability of a mark spacing enables accurate evaluation of the performance of the alignment detection system. Moreover, when a plurality of types of alignment marks are compared to each other in terms of mark spacing repeatability, an excellent alignment mark can be selected from them.

From another point of view, an alignment mark AM on the wafer 6 is detected as a photoelectrically converted electrical signal by an alignment detection system as shown in FIG. 8. FIG. 1A shows a schematic view of an alignment mark AM formed on the wafer 6. FIG. 1A shows the state of the alignment mark AM as seen from above the wafer 6. FIG. 1B shows a detection signal obtained by photoelectrically converting the alignment mark AM. Though, in this embodiment, an alignment mark comprised of four marks is used, according to the present invention, an effect similar to this embodiment can be obtained as far as the alignment mark AM is comprised of two or more marks. The alignment mark is measured in a direction perpendicular to the longitudinal direction of marks M1 to M4.

When measurement is performed while such an alignment mark is driven in the measurement direction, a so-called digital error occurs. When this digital error occurs, a measurement value varies nonlinearly, thereby causing an alignment detection error. This phenomenon will be described with reference to FIGS. 5A and 5B and FIGS. 6A to 6C.

Figure 5A:
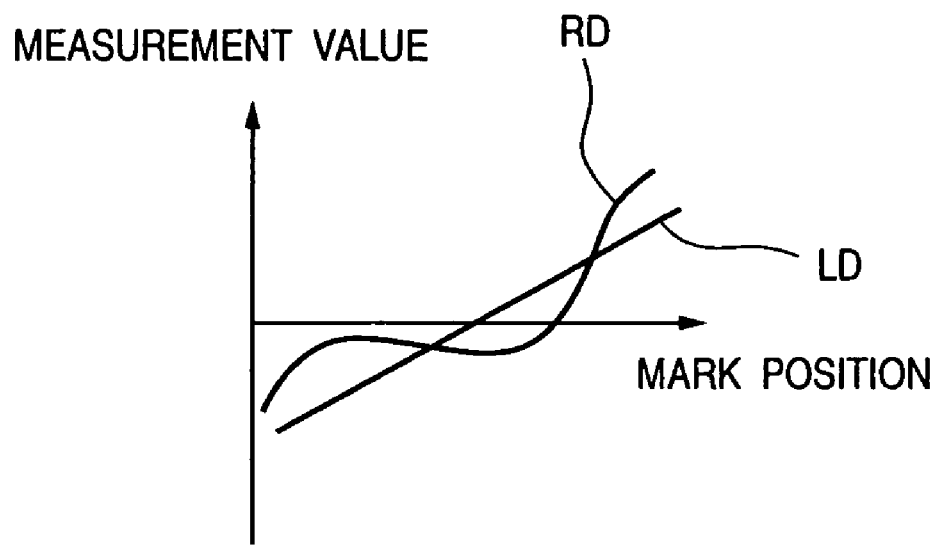
FIGS. 5A and 5B are schematic graphs each showing a digital error with respect to the position of an alignment mark.
Figure 5B:
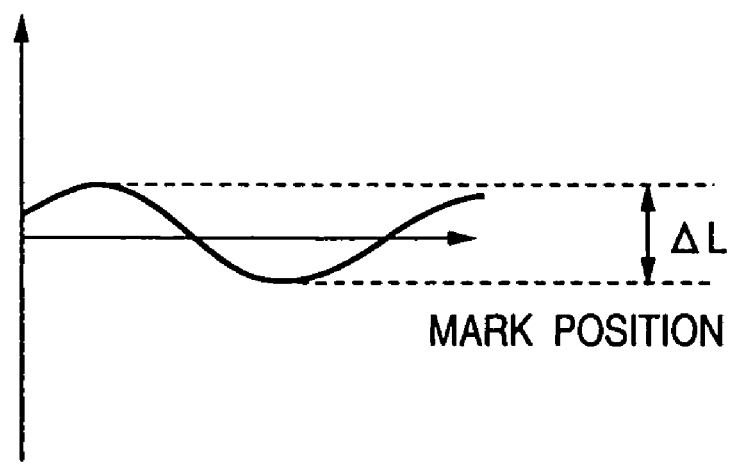

FIG. 5A schematically shows the measurement result when a mark is driven in the measurement direction. If a digital error occurs in a detection system, a measurement value will vary periodically, depending on the position of the mark. The abscissa in FIG. 5A represents the mark position (e.g., a read value of an interferometer of a wafer stage) for the alignment detection system, and the ordinate represents a measurement value of the mark obtained from the alignment detection system. Ideally, it is desirable that the measurement value varies linearly. RD in FIG. 5A represents raw data of a measurement value, and LD is obtained by approximating the raw data (periodical change) with a straight line. FIG. 5B shows a residue from the linear component on the basis of LD, which is represented as ΔL. As shown in FIG. 5B, when a measurement error ΔL occurs for the mark position, an error in measurement value varies, depending on a position at which the alignment mark is located with respect to the alignment detection system. In this case, high-precision alignment detection cannot be performed.

A mechanism in which a digital error occurs will be described in more detail with reference to FIGS. 6A and 6B.

FIGS. 6A to 6C show the waveforms of detection signals in consideration of one mark of the alignment mark shown in FIG. 1B. Dotted lines D in FIGS. 6A to 6C represent sampling points of a detection system. When a CCD camera, or the like, is used as the detection system, each of these sampling points corresponds to a pixel size. If signals are sampled and detected in terms of time, like a laser beam scan, each of the sampling points corresponds to the sampling time. Now, a description will be given for a case wherein the sampling point corresponds to the pixel size of a CCD camera. A detection signal generated from an alignment image captured by a CCD camera is detected and its waveform is displayed at intervals of a sampling interval (image size) of ΔD. FIG. 6A shows the waveform of a detection signal of an alignment mark AM, the position of which coincides with a certain position of the CCD camera. FIGS. 6B and 6C respectively show the waveforms of the detection signals of the alignment mark AM, which is located at positions shifted from the position of the CCD camera by ¼ pixel. In this example, the position of a pixel is changed without changing that of the alignment mark AM. Thus, ideally, a position at which measurement is to be performed (e.g., the centroid of a waveform) is not changed.

However, the signal waveforms in FIGS. 6B and 6C are shifted in opposite directions by ¼ pixel with respect to the waveform in FIG. 6A. For this reason, though the position of the alignment mark does not change, the measurement values have errors by Δ in the shift directions, respectively. In other words, if the position of an alignment mark changes within one pixel, a measurement value shifts periodically. Accordingly, such a digital error needs to be accurately evaluated. Conventionally, to measure such digital error, an alignment mark formed on the wafer stage 8 is calculated while the stage interferometer is plotted along the abscissa and the measurement value is plotted along the ordinate. However, in actual interferometers, fluctuation of air and the like exists, and besides, the interferometers themselves fluctuate.

Figure 7:
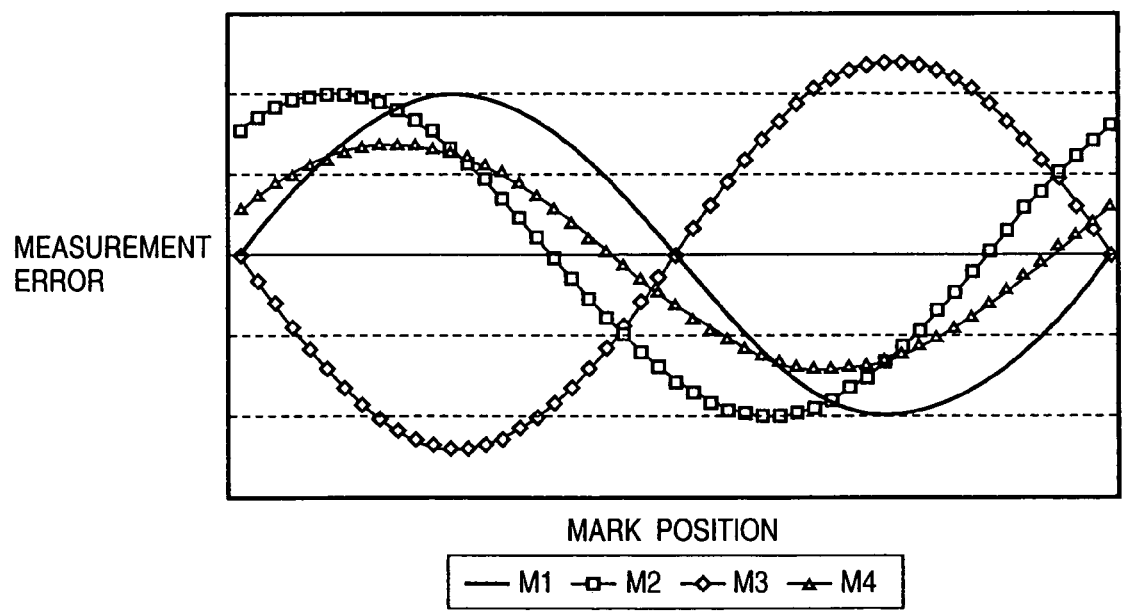
FIG. 7 is a schematic graph showing a digital error with respect to the position of the alignment mark.
Figure 9:
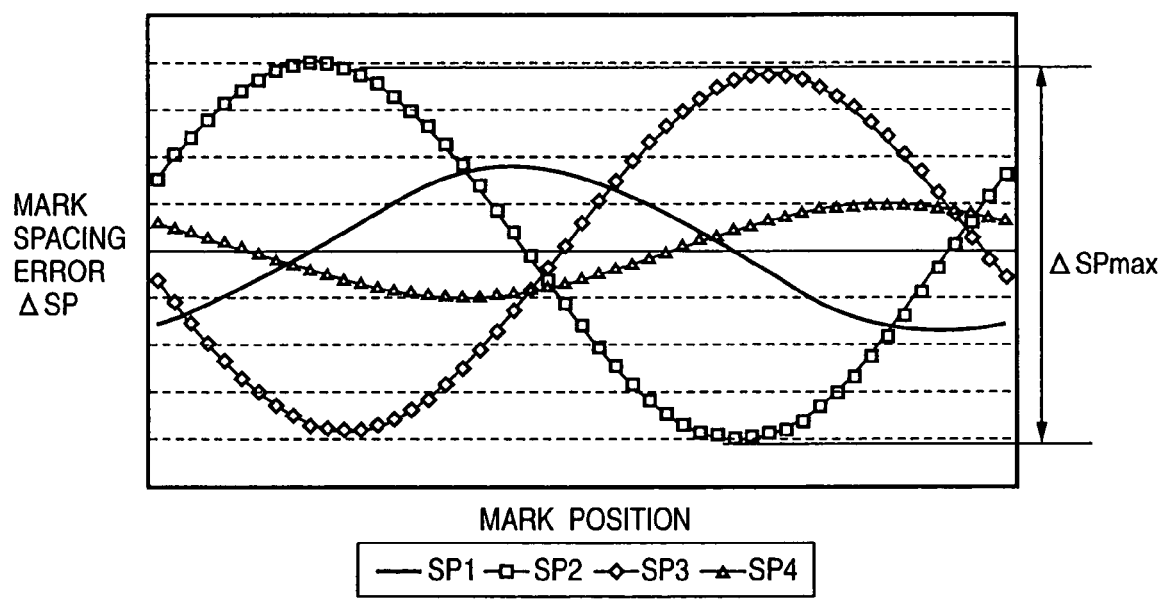
FIG. 9 is a schematic graph showing the variation in mark spacing with respect to an alignment mark position.

Under the circumstances, according to the present invention, a digital error is evaluated by using an alignment mark comprised of a plurality of marks to focus on the spacings between them. In this embodiment, four marks are used, and a digital error is evaluated using spacings SP1, SP2, SP3, and SP4 between the marks, as shown in FIG. 1A. Assume that a digital error occurs in the mark position with respect to an alignment detection system. The variation in mark measurement value and that in mark spacing are schematically shown in FIGS. 7 and 9, respectively. As can be seen from FIG. 7, the measurement value of each mark varies independently. In consideration of an actual alignment mark and alignment detection system, the mark detection area on the pixels of a CCD camera changes depending on marks due to the geometrical error of the alignment mark, the magnification error of the alignment detection system, and the like. Therefore, as shown in FIG. 7, phases of each mark which represent occurrence of a digital error are different from each other. The pixel resolution is generally about 0.1 µm or less, and the absolute value of a mark spacing would have an error of the same magnitude. Alternatively, a design value is so controlled as not to make the pixel resolution and the spacings between alignment marks synchronize with each other. This causes a digital error to occur randomly and prevents it from affecting the total measurement value (the average value of the four mark measurement values). However, an actual detection system may have a manufacturing error, an evaluation of such error is required.

FIG. 9 shows the variation in mark spacing in a case wherein each of the four marks has a relatively independent digital error. As can be seen from FIG. 9, each of the mark spacings (SP1 to SP4) varies periodically.

Since the measurement result is obtained by using a constant reference, mark spacing, an error from a stage interferometer is not contained. Thus, a digital error can accurately be measured.

As described above, checking the variation amount of the mark spacings in driving the stage and the mark spacing repeatability while the mark position is fixed enables pure evaluation of the precision as the alignment detection system or that of an alignment signal.

Second Embodiment

With the measurement result of the mark spacings between a plurality of marks of an alignment mark, an alignment mark of an actual process wafer or optimization of the illumination mode will be described with reference to FIGS. 10 and 11.

Figure 10:
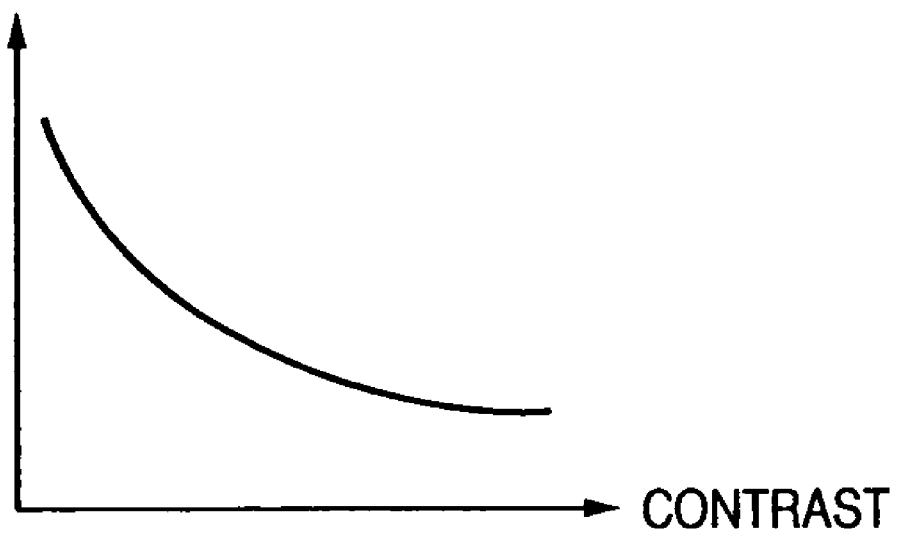
FIG. 10 is a schematic graph showing the measurement repeatability and contrast.

FIG. 10 shows the relationship between the mark spacing repeatability of a certain alignment mark and the contrast (e.g., the min/max ratio of the signal strength). As can be seen from FIG. 10, as the contrast becomes high, the repeatability of mark spacings is improved. This means that the measurement repeatability of the central position of a plurality of (four) marks will be improved. One reason for this may be that the S/N ratio is increased with higher contrast due to an electrical processing-based noise component mixed into a photoelectrically converted signal from a photoelectric conversion element. Thus, when an illumination mode or alignment mark with contrast as high as possible as selected, an improvement in measurement repeatability is expected.

Figure 11:
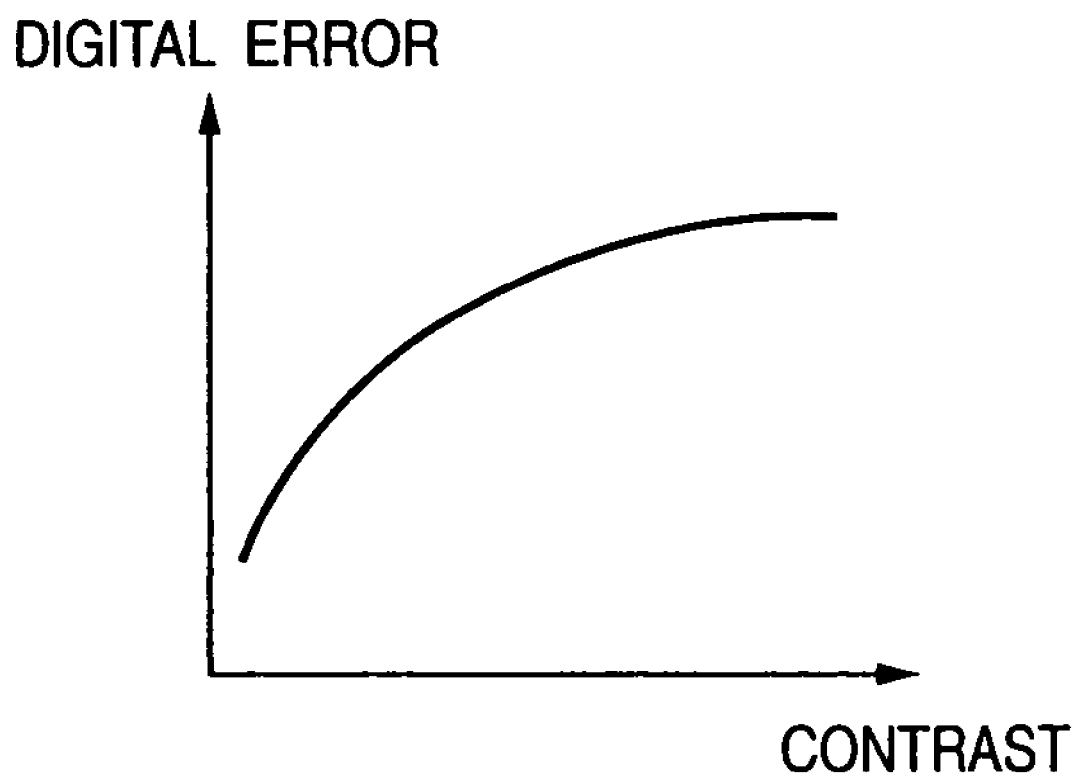
FIG. 11 is a schematic graph showing the digital error and contrast.

FIG. 11 is a graph showing the relationship between the contrast and the digital error. As for the digital error, when a signal changes abruptly within one pixel (the contrast becomes high), the magnitude of the signal increases at the boundary region between pixels. Accordingly, if the contrast becomes extremely high, the digital error increases, as shown in FIG. 11.

In other words, the repeatability of a mark and the digital error act on the contrast in directions where the measurement precisions are opposite.

Therefore, the optimum alignment mark or illumination mode must be selected in consideration both of the measurement repeatability of the mark position (the mark spacing repeatability) and occurrence amount of digital errors.

As described above, performance such as the repeatability of mark spacings, the digital error, or the like, is not limited to objects used to detect an alignment mark AM as an image, such as a CCD camera.

For example, it is applicable to an alignment detection system of the laser beam scan type for scanning a slit-like illumination beam and detecting the position of a mark by scattered light and diffracted light from the alignment mark AM. The pixel size of the CCD camera corresponds to the sampling time when laser beam scan is performed. It will be apparent that a similar effect of the present invention can be obtained by evaluating a mark spacing as a time from the detection timing of a given mark to the detection timing of another mark.

In addition, in the above embodiment, an alignment detection system which detects an alignment mark AM on a wafer has been described. However, the present invention is not limited to this. For example, the present invention can apparently be applied to an alignment detection system (corresponding to the system represented by 11 in FIG. 4) which aligns a reticle and an alignment detection system (not shown) of the so-called TTR-AA (Through the Reticle-Auto Alignment) type which views respective marks on a reticle 2 and wafer at the same time through the reticle 2 and a projection optical system 3.

The optimization of an alignment mark of an actual process wafer and a method of selecting the optimum illumination mode will be described with reference to FIGS. 12 and 13.

Figure 12:
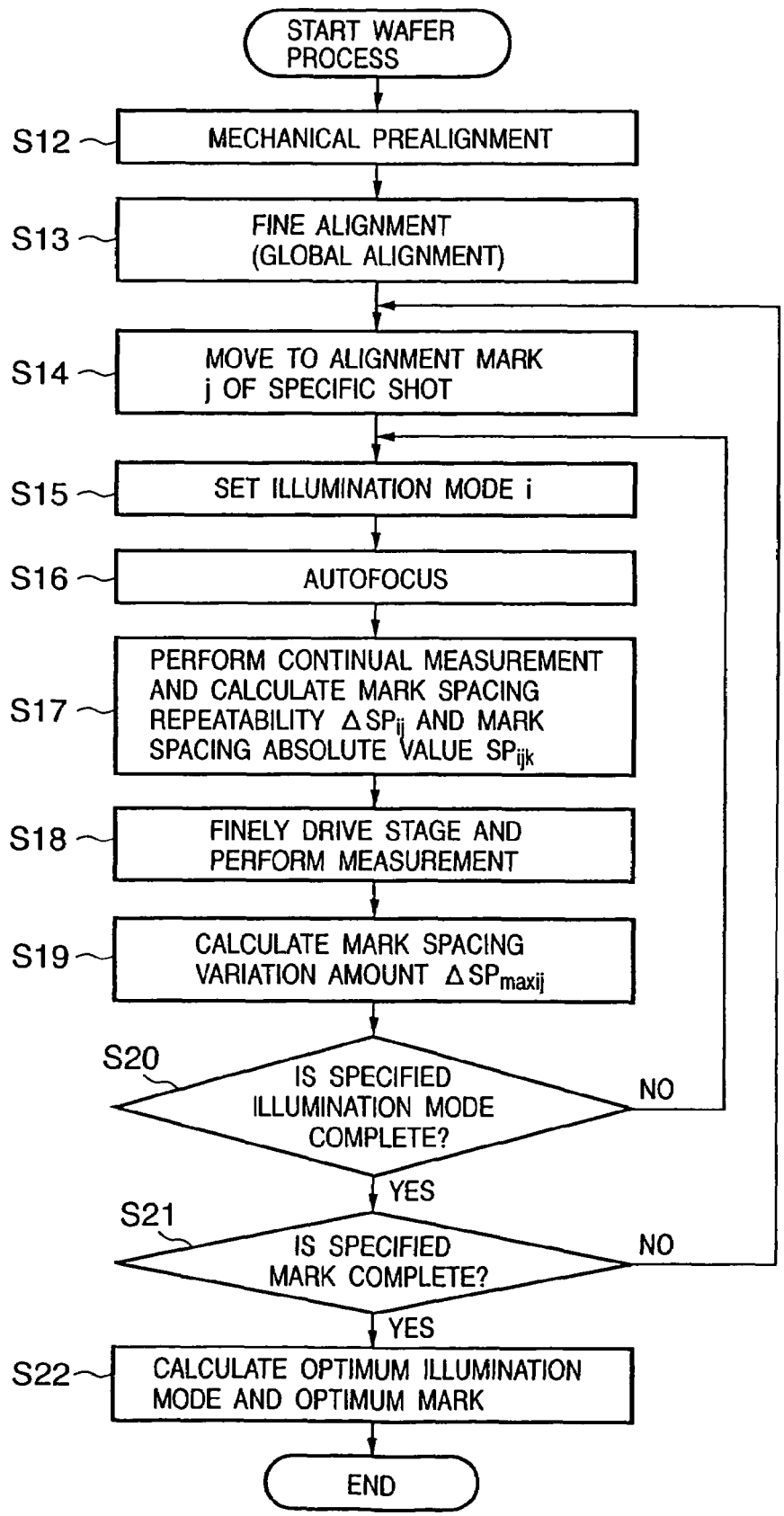
FIG. 12 is a flow chart showing the procedure of selecting the optimum alignment mark and illumination mode.

Referring to FIG. 12, when the wafer process starts, rough alignment (mechanical prealignment) of a wafer is performed (step S12). This rough alignment is performed at a precision sufficient for fine alignment (so-called global alignment) to be executed later. In fine alignment, the shot layout of the wafer is measured by an alignment detection system and an interferometer of a wafer stage, and the layout information of shots (chips) is calculated (step S13).

Afterwards, the first alignment mark (j=1) of a specific shot, which is set in advance, is driven to an alignment detection position (step S14). Note that this driving is performed on the basis of the obtained shot layout information.

The alignment detection system sets the first illumination mode (i=1; illumination σ and wavelength to be used) (step S15). The user can set in advance the number of types of illumination modes and that of alignment marks to be used. In the setting, the first alignment mark is arranged to be measured in the first illumination mode.

While the first alignment mark is observed in the first illumination mode, measurement of the wafer in the Z direction (focus measurement) is then performed. After the best focus position for the alignment detection system is calculated, the wafer is driven to the position (step S16). This autofocus is measured while focusing on a differential value of the signal waveform and a position at which the contrast of the detection signal waveform of an alignment mark maximizes. With the above-described processing, the first alignment mark can be measured in a high contrast stage in the first illumination mode.

Next, a detection signal obtained by photoelectrically converting the image of the first alignment mark is received a plurality of number of times. A mark spacing is calculated from the detection signal at each time, and the repeatability $\Delta SP_{ij}$ (i=1, j=1) and the absolute value of the mark spacings $SP_{ijk}$ (i=1, j=1, k=1) are calculated from the measurement values (step S17). The mark spacing repeatability may be evaluated using statistical 3σ or a range. The absolute value of the mark spacings $SP_{ijk}$ is set to the average value of measurement values which are received a plurality of number of times. Note that the number of times of measurement may be set in advance by the user or may be the number of times specific to the device.

After the state is finely driven, the absolute value of the mark spacings $SP_{ijk}$ (i=1, j=1, k=2) is calculated in the same manner, as in step S17 (step S18).

At this time, the measurement repeatability may or may not be calculated. If the measurement repeatability is not calculated, the mark spacing repeatability calculated in step S17 is set to be the repeatability of the first alignment mark in the first illumination mode. If it is calculated, the average value of the measurement repeatability values can be used as the repeatability of the first alignment mark in the first illumination mode. That is, $\Delta SP_{ij}=\Sigma \Delta SP_{ijk}/k(max)$; k(max) is the number of times of driving the stage.

The calculation process (step S17 to S19) of the fine driving of the stage and the variation in mark spacing will be described in detail with reference to FIG. 13.

Figure 13:
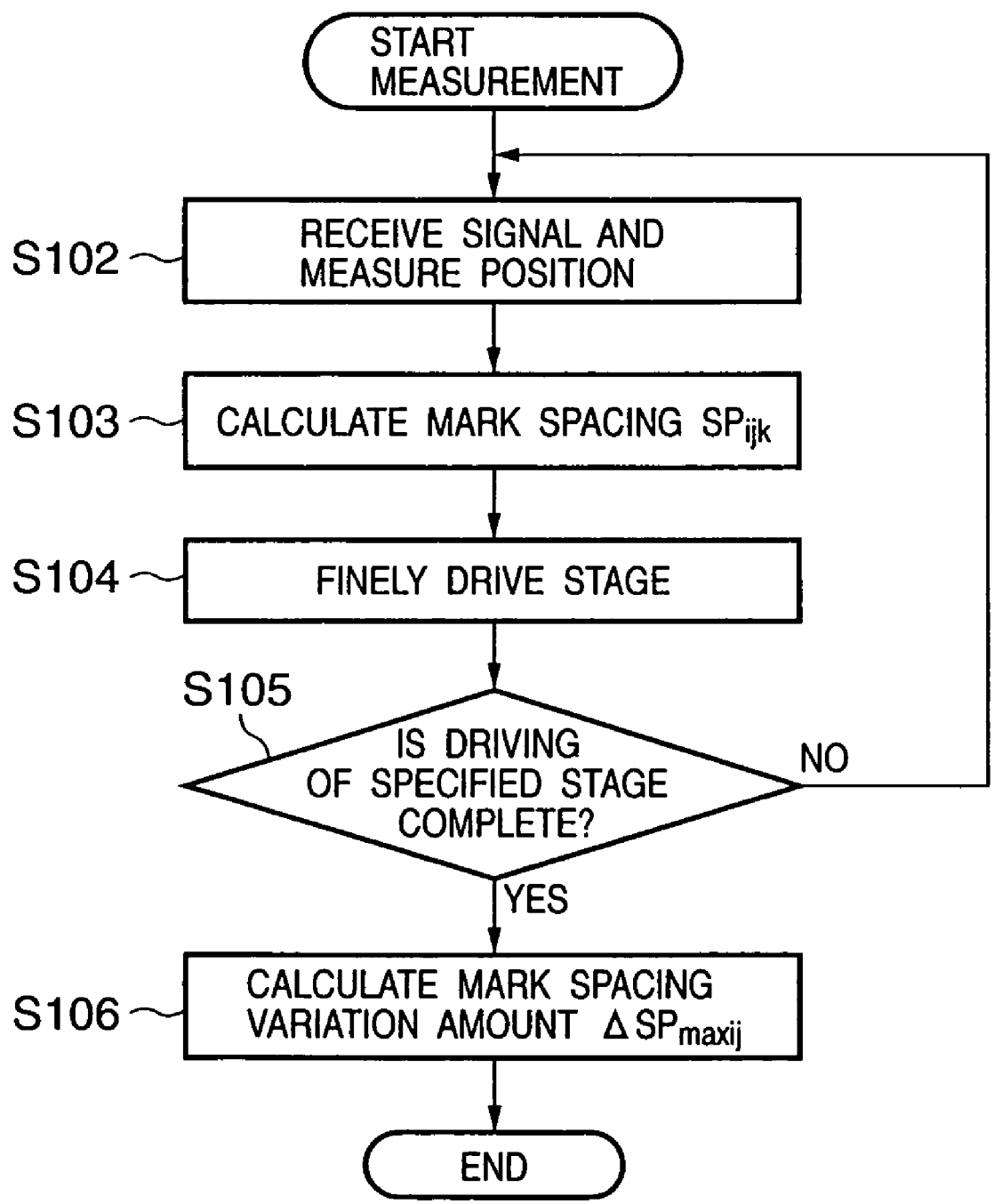
FIG. 13 is a flow chart showing the procedure of selecting the optimum alignment mark and illumination mode.

Referring to FIG. 13, after starting the measurement in step S17, a signal is received by the photoelectric conversion element, and the position of each of four marks is calculated. At this time, reception of a signal is performed a plurality of number of times (step S102), as described above. After the mark spacing ($SP_{ijk}$; i=1, j=1, k=1) is calculated at each of the mark positions (step S103), the wafer stage is finely driven (step S104). The driving amount may be defined in advance as a design value or set by the user. In either case, driving is preferably performed in an amount smaller than the image resolution. Then, it is judged whether a predetermined number of times of driving measurements are complete or not. If they are not complete, the flow returns to step S102 to calculate the mark spacing ($SP_{ijk}$; i=1, j=1, k=2 or more) (step S105).

As described above, the variation amount $\Delta SP_{maxij}$ of the mark spacing is calculated while the stage is finely driven within a specific stage driving range. Note that the stage driving range can also be set by the user or defined as a design value. The variation amount $\Delta SP_{maxij}$ of the mark spacing obtained while driving the stage is set as the value of the first alignment mark in the first illumination mode (steps S106 and S19). Referring back to FIG. 12, two values, the mark spacing repeatability $\Delta SP_{ij}$ (i=1, j=1) and mark spacing variation amount $\Delta SP_{maxij}$ (i=1, j=1) are obtained in the first alignment mark in the first illumination mode.

Then, it is judged whether the measurement in the specified illumination mode is complete or not (step S20). If it is not complete, the flow returns to step S15, where the illumination mode is switched to another illumination mode, and $\Delta SP2_j$ and $\Delta SPM2_j$ are similarly calculated.

If evaluation in the specified illumination mode is complete, it is judged whether evaluation of a plurality of types of alignment marks is complete or not (step S21). If it is not complete, the stage is driven to the next alignment mark position, and $\Delta SP_{ij}$ and $\Delta SP_{maxij}$ are similarly calculated.

With the above sequence, $\Delta SP_{ij}$ and $\Delta SP_{maxij}$ for a plurality of alignment marks and illumination modes can be obtained. The optimum alignment mark and illumination mode (optimum calculation) can be calculated on the basis of $\Delta SP_{ij}$ and $\Delta SP_{maxij}$ (step S22).

Note that when the optimum condition is to be calculated, the balance between $\Delta SP_{ij}$ and $\Delta SP_{maxij}$ may be set in advance. For example, calculation may be performed on the condition that $\Delta SP_{ij}=\Delta SP_{maxij}$, or the ration of $\Delta SP_{ij}$ to $\Delta SP_{maxij}$ may be changed. In short, the present invention is characterized by calculating the optimum condition on the basis of the mark spacing repeatability and mark spacing variation. In this example, the variation amount in mark spacing $\Delta SP_{maxij}$ is calculated from the range of the variation amount. The present invention is not limited to this. The variation amount $\Delta SP_{maxij}$ may be evaluated using 3σ or the like.

Using the optimum alignment mark and optimum illumination mode obtained in the above-described manner, normal alignment operation and exposure is started.

Though in this embodiment, evaluation is performed using one wafer and a specific shot, it can similarly be performed using a plurality of wafers and shots to select the optimum condition on the basis of the evaluation result. This measurement is effective when process variations between wafers are large, and when variations between shots are large. When variations are large, the optimum condition is not optimum for all the wafers even if the maximum value can be obtained for a specific wafer and specific shot. Therefore, the optimum condition, which is averagely stable for all the wafers, can be calculated using a plurality of pieces of information.

Third Embodiment

Figure 14:
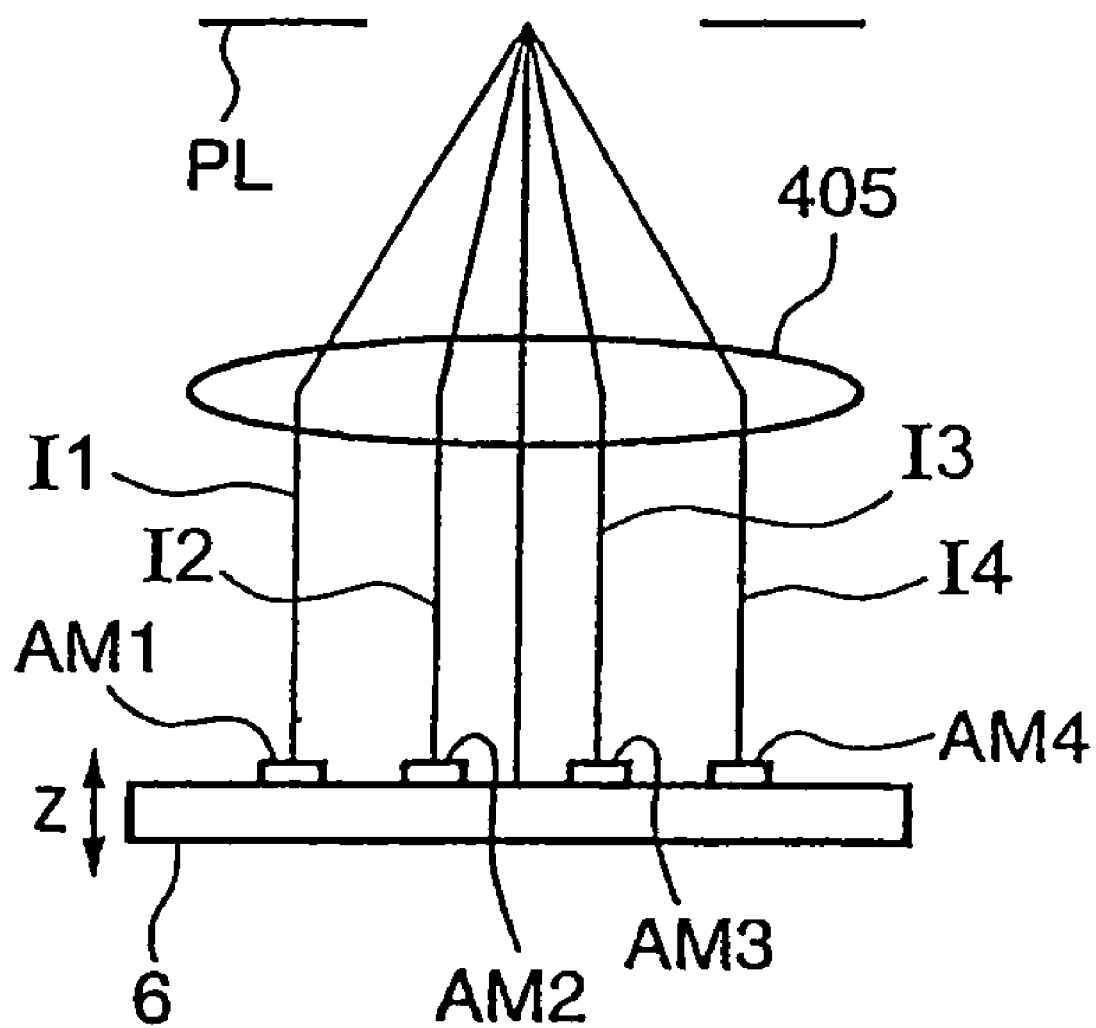
FIG. 14 is a schematic view showing a case wherein the off-axis telecentricity is good.
Figure 15:
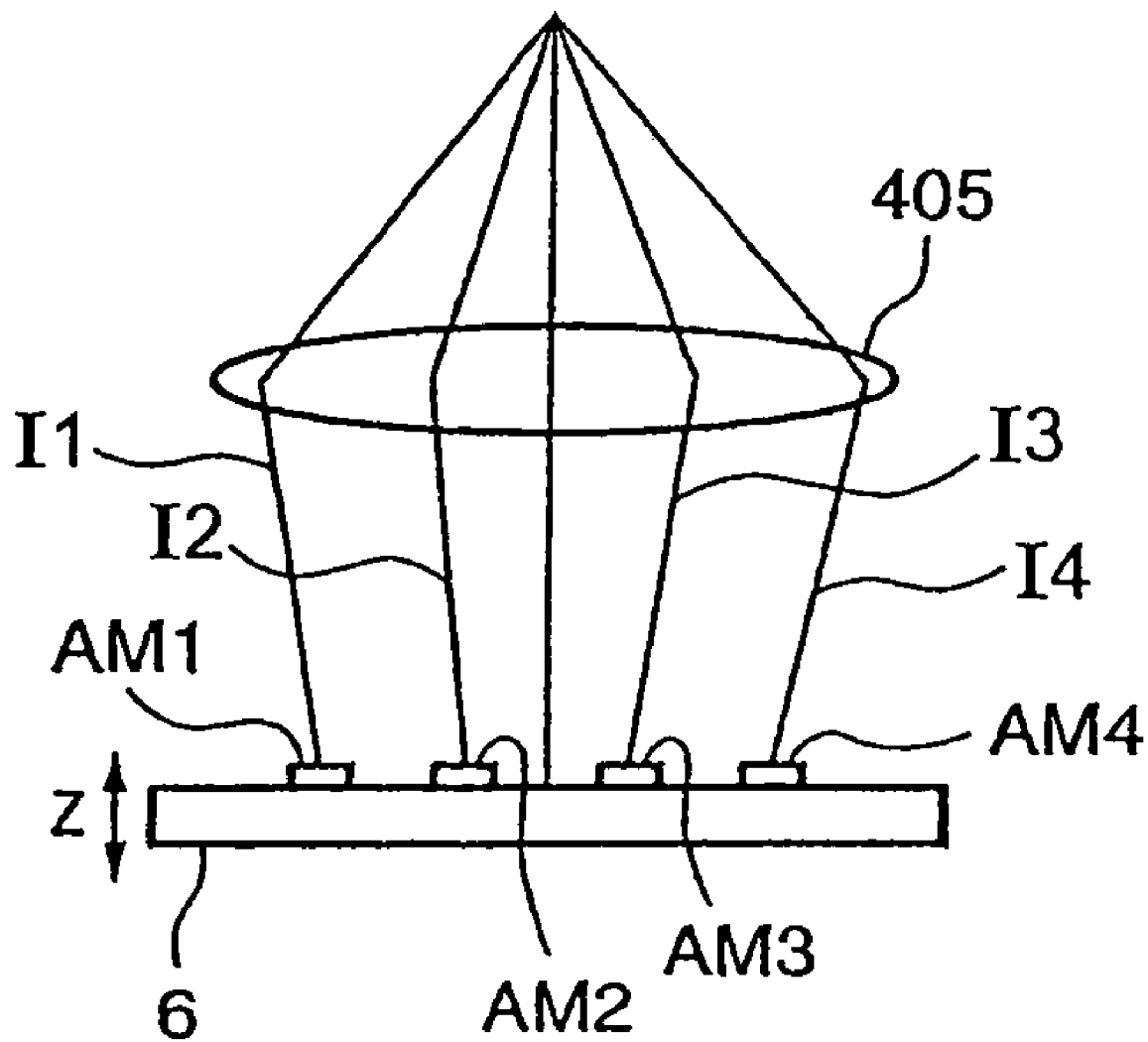
FIG. 15 is a schematic view showing a case wherein the off-axis telecentricity is poor.

Another embodiment using a mark spacing will be described next. FIGS. 14 and 15 respectively show the objective lens 405 of the alignment detection system and object stop PL (the Fourier transform plane of an object plane; a pupil) extracted from FIG. 8. Also, FIGS. 14 and 15 schematically represent alignment marks AM1 to AM4 formed on a wafer 6 and respective principal rays I1 to I4 from the alignment marks. FIG. 14 shows how the respective principal rays I1 to I4 from the alignment marks are detected so that they are parallel to each other and perpendicular to the wafer plane (the so-called off-axis telecentricity is good).

FIG. 15 shows that the off-axis telecentricity is poor due to the manufacturing error of the objective lens 405, the incident optical axis inclination of an illumination system (not shown), the position shift of an aperture stop 415 in the focus direction Z, and the like. In this case, the principal rays (I1 to I4) from the alignment marks are not parallel to each other and are not perpendicular to the wafer.

In this case, the mark spacing varies with respect to the position of the wafer in the focus direction Z. In the case of FIG. 14, even when the wafer is in a defocused state, change in mark spacing does not occur. Even if the wafer is in a defocused state and the mark is shifted in the measurement direction, the variation in mark spacing does not occur (a linearity residue is not generated). On the other hand, in the case of FIG. 15, if the wafer is defocused, the mark spacing varies. Since the inclination of each principal ray is different from each other at an off-axis position (depending on image heights), if the mark is driven in the measurement direction, the mark spacing varies (a linearity residue is generated).

Figure 16:
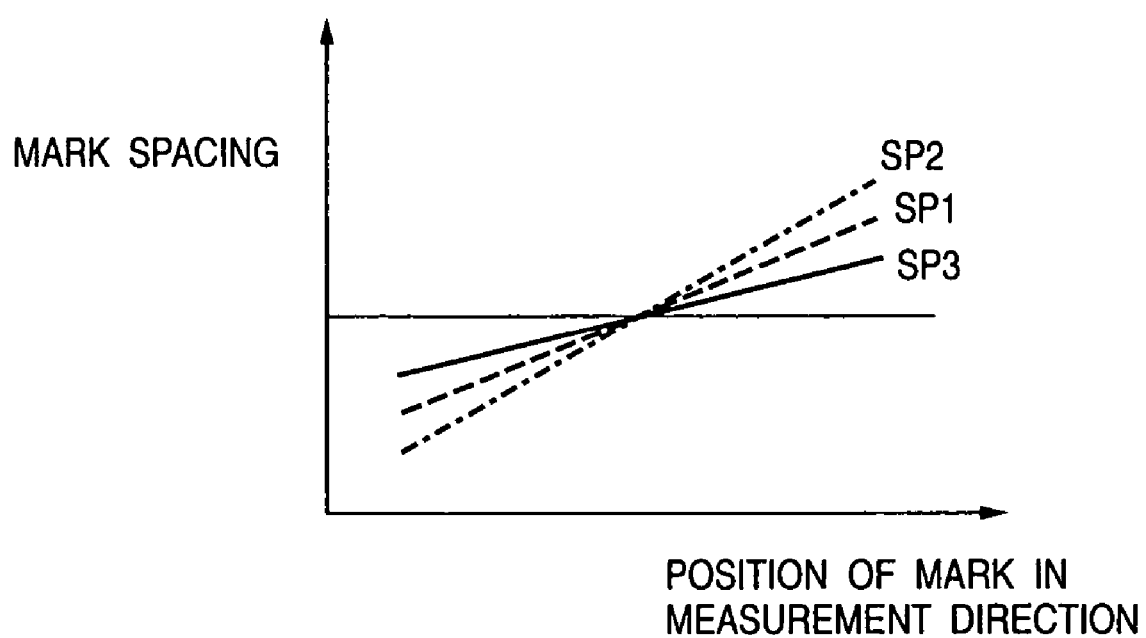
FIG. 16 is a schematic graph showing the alignment mark measurement position in measurement with a poor off-axis telecentricity in a defocused state.

The measurement error (linearity) in a case wherein a mark is driven in the measurement direction in a defocused state with poor off-axis telecentricity will be described with reference to FIG. 16. A defocused state with poor off-axis telecentricity corresponds to a state in which distortion occurs in the detection range, i.e., the magnification changes in the detection range, depending on the angle of view. In this case, while the driving position in the mark measurement direction is plotted along the abscissa and the variation in mark spacing is plotted along the ordinate, as shown in FIG. 16, the mar spacing narrows or broadens. In a detection system with such variation, a measurement value is shifted for the central position of the four marks depending on the location, in the detection system, of the marks, thus disabling measurement of a linear position (a linearity residue is generated).

In this case, unless a mark is accurately fed with respect to the detection system, a measurement shift occurs by a residue, thus degrading the alignment precision.

To avoid this, a method (close drive-in measurement) of always feeding a mark to a predetermined off-axis position to measure the mark is available. However, this method causes a decrease in throughput, thus leading to a demerit of the device. Therefore, measurement with a linearity residue as small as possible is significant.

Figure 17:
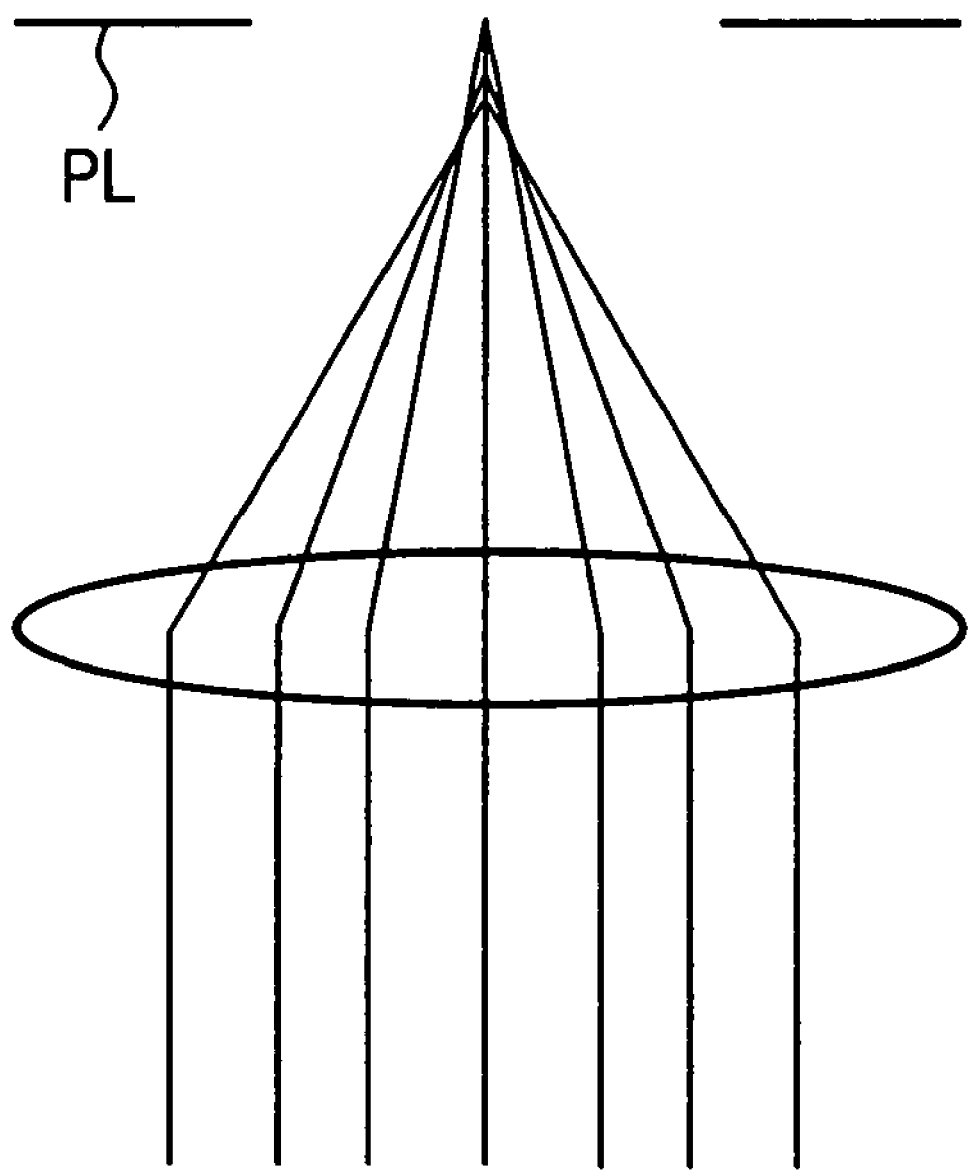
FIG. 17 is a schematic view of the spherical aberration of a pupil.

One reason for poor off-axis telecentricity, as shown in FIG. 15, is that spherical aberration occurs on a pupil plane when imaging trace is performed for the pupil of an objective lens (the spherical aberration of the pupil is responsible), as shown in FIG. 17. Parallel principal rays from image heights do not focus on the pupil plane and have spherical aberration. Other reasons are, e.g., that spherical aberration exists in a pupil as an illumination system and that the position of the pupil is shifted in the focus direction (the position of the aperture stop 415 is shifted in the focus direction).

As described above, when an alignment mark is measured when in a defocused state with respect to the detection system with poor off-axis telecentricity, a linearity residue is generated, thus degrading the alignment precision. For this reason, the off-axis telecentricity needs to be measured and adjusted.

Figure 18:
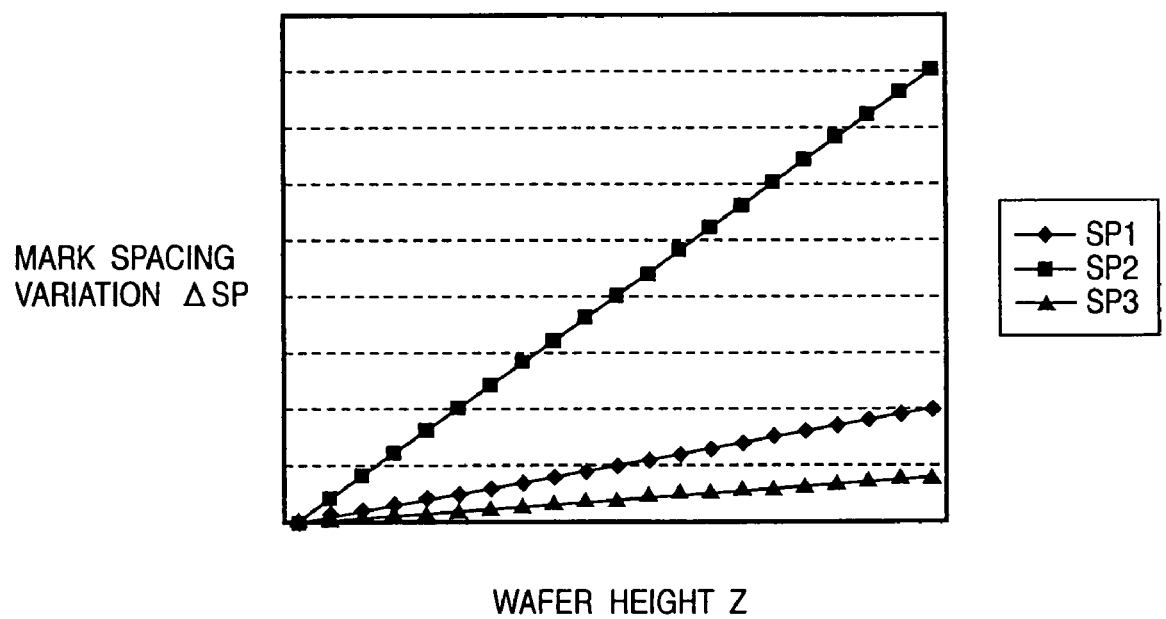
FIG. 18 is a schematic graph showing the variation in mark spacing in measurement with a poor off-axis telecentricity in a defocused state.

This can be achieved only by driving a wafer in the focus direction Z using an alignment mark comprised of a plurality of marks (four marks in this embodiment) and measuring the mark spacing for each Z position. An example for this is shown in FIG. 18. In FIG. 18, a case is shown in which all of four principal rays I1 to I4 have inclinations, respectively, and are not parallel to each other. In addition, the absolute value of the inclination amount of the principal ray I2 is different from that of the principal ray I3. The abscissa represents the Z position of the wafer, and the ordinate represents the change in mark spacing using the mark spacing at the best focus position as a reference. As thus described, when the off-axis telecentricity is poor, the mark spacing changes with respect to the Z position. If the linearity is measured at a defocused position with the detection system adjusted in this way, a residue component of the measurement linearity is generated for the mark position with respect to the detection system.

Consider an alignment detection system in an actual exposure apparatus. The best focus position may change slightly depending on wafers and chips due to variation in thickness of resist films of an actual process wafer. In this case, since measurement is consequently performed in a defocused state, any error component as described above must be minimized.

As shown in FIG. 18, when the mark spacing is measured while the wafer is swung in the focus direction Z, the off-axis telecentricity can be observed. The alignment detection system is so adjusted as not to cause variation in mark spacing.

To adjust this, a method of adjusting the position of the object to stop PL in the focus direction Z or a direction perpendicular to an optical axis, or the like, is available. A similar effect can be obtained by adjusting the focus of the aperture stop (aperture stop 415 in FIG. 8) formed in the illumination system or adjusting any spherical aberration of a pupil by an adjusting mechanism provided in the objective lens itself. Either method can be used. The present invention is characterized by measuring a mark spacing while swinging a wafer in the focus direction Z.

A method of adjusting the off-axis telecentricity by adjusting the position of the object stop PL will be described with reference to FIGS. 19A to 19C. In this example, spherical aberration of a pupil as described above does not exist, and a thin optical system is employed. FIG. 19A shows the positional relationship between an ideal alignment mark position, the objective lens 405, and the object stop PL. Let f be the focal length of the objective lens 405. When the position of the object stop PL is located at a distance of f from the objective lens, principal rays I1 to I4 of all angles of view are parallel to each other. That is, the off-axis telecentricity becomes good. However, if the position of the object stop PL is shifted from the position at a distance of f from the objective lens (FIGS. 19B and 19C), principal rays I1' to I4' are no longer parallel to each other. That is, the off-axis telecentricity is poor. In this case, if an alignment mark AM is defocused, the mark spacing varies. In addition, if the linearity is measured in a defocused state, a linearity residue is generated.

The position of the object stop PL is so adjusted as to be an ideal f position. At this time, observing the variation in mark spacing (FIG. 18) in a defocused state makes it possible to observe the off-axis telecentricity. Preferably, the position of the object stop PL is so adjusted as to remove inclinations of variations in all the mark spacings.

In the above description, an example is shown in which the object stop PL is adjusted in the focus direction Z. However, the present invention is not limited to this. The same effect can be obtained by adjusting another stop arranged at a position conjugate to the object stop PL in the focus direction. More specifically, the same effect can be obtained by adjusting the rotation aperture stop 415 shown in FIG. 8 in the focus direction.

Figure 20:
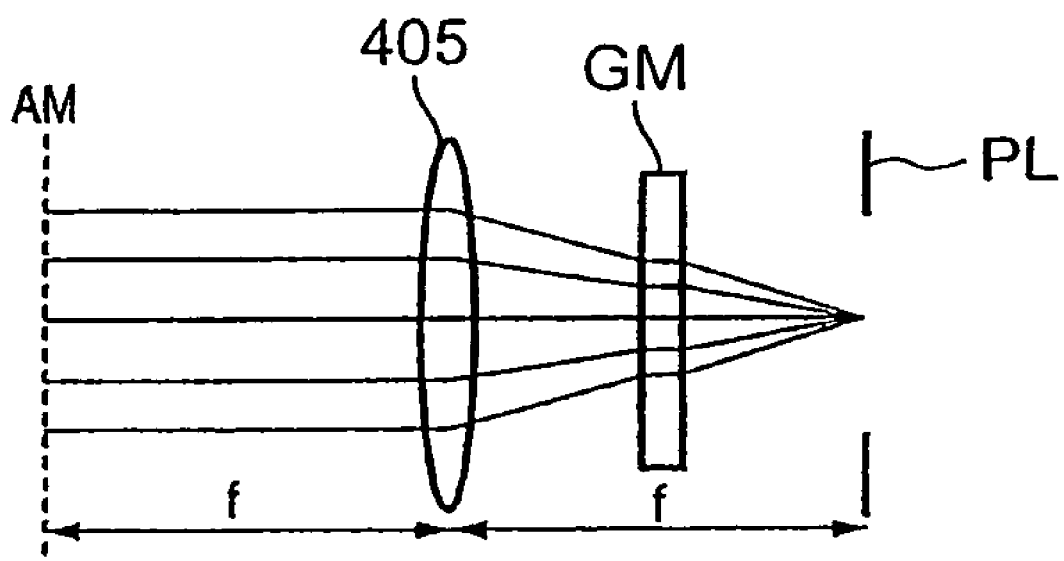
FIG. 20 is a schematic view showing an example of correction of the spherical aberration of a pupil.

An example is shown in FIG. 20 in which spherical aberration occurs in a pupil.

In this example, a glass member GM is arranged between the objective lens 405 and the object stop PL. This glass member can take various forms depending on the design value (how spherical aberration occurs in a pupil) of the objective lens 405. The glass member may be comprised of a simple glass plate or a glass member with a curvature (a so-called lens) may be inserted to correct the spherical aberration. In either case, the spherical aberration can be corrected by locating such an optical member in the vicinity of the object stop, thereby enabling correction and adjustment of the off-axis telecentricity. In actual adjustment, the thickness or curvature of a glass plate is changed while observing the variation amount of the mark spacing. This makes it possible to correct the spherical aberration of a pupil which occurs during manufacturing.

As described above, by driving an alignment mark in the focus direction Z and plotting the mark spacing at each Z position, the so-called off-axis telecentricity can be observed. An improvement in off-axis telecentricity (the principal rays of all angles of view are incident perpendicularly to a mark) avoids generation of a linearity residue, thereby enabling position detection at high precision.

Obviously, the above-described embodiments are not limited to an OA detection system. That is, these embodiments are applicable to an alignment detection system which observes an alignment mark AM on a wafer through a projection optical system, an alignment detection system which detects the position of a reticle, and a TTR-AA system which detects a reticle and wafer through a projection optical system.

In addition, the present invention provides an apparatus capable of high-precision position detection by applying an alignment detection system as described above to a semiconductor exposure apparatus and liquid crystal exposure apparatus.

Embodiment of a Semiconductor Production System

Next, an example of a semiconductor device (e.g., a semiconductor chip of an IC, LSI or the like, a liquid crystal panel, a CCD, a thin film magnetic head, a micromachine, etc.) production system using the apparatus of the present invention will be described. The system performs maintenance services such as trouble-shooting, periodical maintenance or software delivery for fabrication apparatuses installed in a semiconductor manufacturing factory, by utilizing a computer network outside the fabrication factory.

Figure 21:
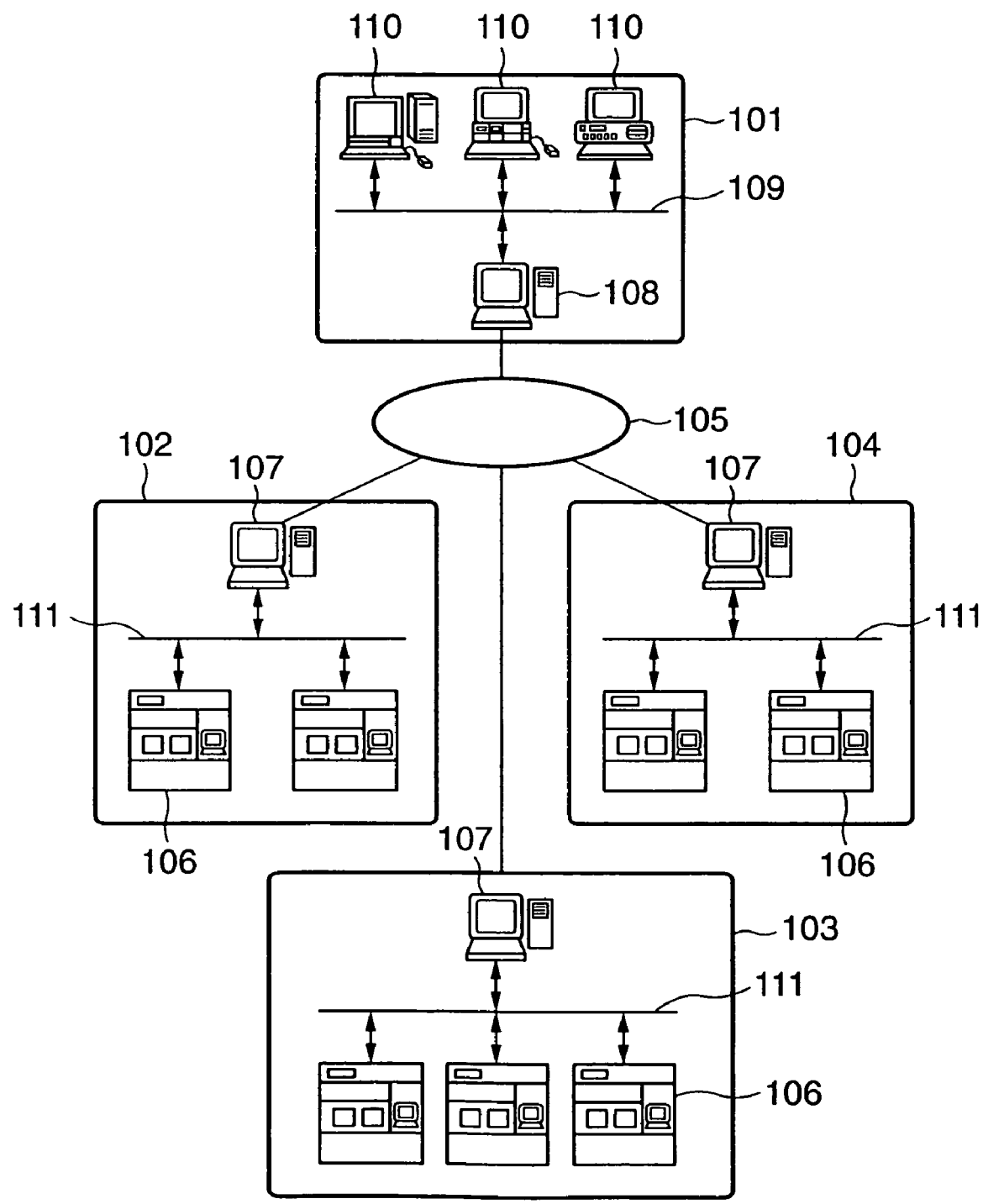
FIG. 21 is a conceptual diagram of a semiconductor device production system using the apparatus according to the embodiment, viewed from an angle.

FIG. 21 shows the entire system cut out from an angle. In the figure, numeral 101 denotes the office of a vendor (apparatus maker) of semiconductor device fabrication apparatuses. As the semiconductor fabrication apparatuses, apparatuses in the semiconductor fabrication factory for performing various processes, such as preprocess apparatuses (e.g., lithography apparatuses including an exposure apparatus, a resist processing apparatus and an etching apparatus, a heat processing apparatus, a film forming apparatus, a smoothing apparatus, and the like) and postprocess apparatuses (e.g., an assembly apparatus, an inspection apparatus, and the like) are used. The office 101 has a host management system 108 to provide a maintenance database for the fabrication apparatus, plural operation terminal computers 110, and a local area network (LAN) 109 connecting them to construct an Intranet, or the like. The host management system 108 has a gateway for connection between the LAN 109 and the Internet 105 as an external network and a security function to limit access from the outside.

On the other hand, numerals 102 to 104 denote fabrication factories of semiconductor makers as users of the fabrication apparatuses. The fabrication factories 102 to 104 may belong to different makers or may belong to the same maker (e.g., preprocess factories and postprocess factories). The respective factories 102 to 104 are provided with plural fabrication apparatuses 106, a local area network (LAN) 111 connecting the apparatuses to construct an Intranet, or the like, and a host management system 107 as a monitoring apparatus to monitor operating statuses of the respective fabrication apparatuses 106. The host management system 107 provided in the respective factories 102 to 104 has a gateway for connection between the LAN 111 and the Internet 105 as the external network. In this arrangement, the host management system 108 on the vendor side can be accessed from the LAN 111 in the respective factories via the Internet 105, and only limited user(s) can access the system by the security function of the host management system 108. More particularly, status information indicating the operating statuses of the respective fabrication apparatuses 106 (e.g., problem of fabrication apparatus having trouble) is notified from the factory side to the vendor side via the Internet 105, and maintenance information such as response information to the notification (e.g., information indicating measure against the trouble, or remedy software or data), latest software, help information, and the like, is received from the vendor side via the Internet. The data communication between the respective factories 102 to 104 and the vendor 101 and data communication in the LAN 111 of the respective factories are performed by using a general communication protocol (TCP/IP). Note that, as the external network, a private-line network (an ISDN, or the like) with high security against access from outsiders may be used in place of the Internet.

Further, the host management system is not limited to that provided by the vendor, but a database constructed by the user may be provided on the external network, to provide the plural user factories with access to the database.

Figure 22:
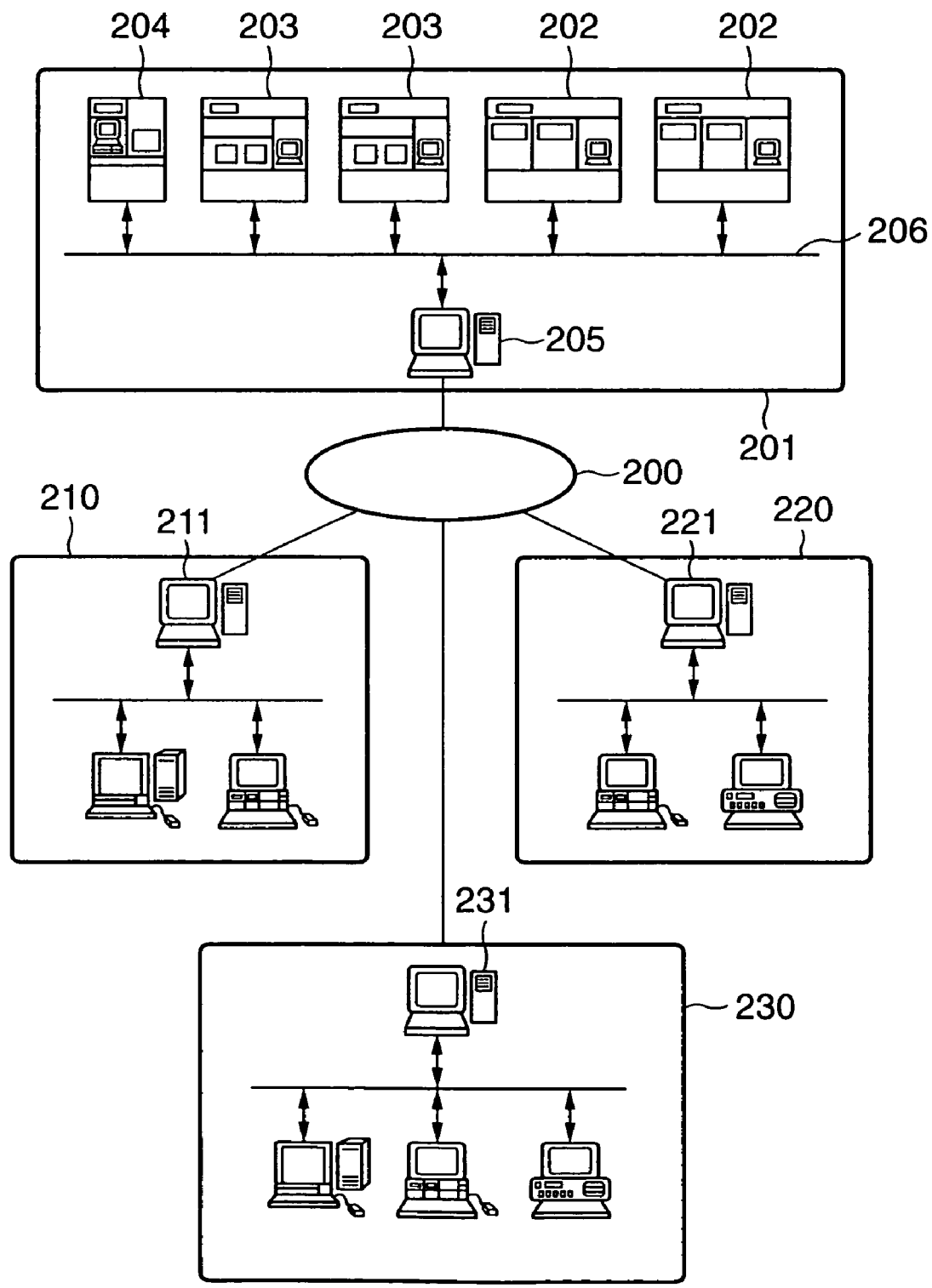
FIG. 22 is a conceptual diagram of the semiconductor device production system using the apparatus according to the embodiment, viewed from another angle.

FIG. 22 is a conceptual diagram showing the entire system of the present embodiment cut out from another angle different from that in FIG. 21. In the above example, the plural user factories respectively having fabrication apparatuses and the management system of the apparatus vendor are connected via the external network, and data communication is performed for production management for the respective factories and transmission of information on at least one fabrication apparatus. In this example, a factory having fabrication apparatuses of plural vendors is connected with management systems of the respective vendors of the fabrication apparatuses via the external network, and data communication is performed for transmission of maintenance information for the respective fabrication apparatuses. In the figure, numeral 201 denotes a fabrication factory of a fabrication apparatus user (e.g., a semiconductor device maker). In the factory fabrication line, fabrication apparatuses for performing various processes, an exposure apparatus 202, a resist processing apparatus 203 and a film forming apparatus 204, are used. Note that FIG. 22 shows only the fabrication factory 201, however, actually, plural factories construct the network. The respective apparatuses of the factory are connected with each other by a LAN 206 to construct an Intranet, and a host management system 205 performs operation management of the fabrication line.

On the other hand, the respective offices of vendors (apparatus makers), an exposure apparatus maker 210, a resist processing apparatus maker 220, a film forming apparatus maker 230 have host management systems 211, 221 and 231 for remote maintenance for the apparatuses, and as described above, the systems have the maintenance database and the gateway for connection to the external network. The host management system 205 for management of the respective apparatuses in the user fabrication factory is connected with the respective vendor management systems 211, 221 and 231 via the Internet or private-line network as an external network 200. In this system, if one of the fabrication apparatuses of the fabrication line has trouble, the operation of the fabrication line is stopped. However, the trouble can be quickly removed by receiving the remote maintenance service from the vendor of the apparatus via the Internet 200, thus the stoppage of the fabrication line can be minimized.

The respective fabrication apparatuses installed in the semiconductor fabrication factory have a display, a network interface and a computer to execute network access software stored in a memory and device operation software. As a memory, an internal memory, a hard disk or a network file server may be used. The network access software, including a specialized or general web browser, provides a user interface screen image as shown in FIG. 23 on the display. An operator who manages the fabrication apparatuses in the factory checks the screen image and inputs information of the fabrication apparatus, a model 301, a serial number 302, a trouble case name 303, a date of occurrence of trouble 304, an emergency level 305, a problem 306, a remedy 307 and a progress 308, into input fields on the screen image. The input information is transmitted to the maintenance database via the Internet, and appropriate maintenance information as a result is returned from the maintenance database and provided on the display. Further, the user interface provided by the web in the figure, and the operator access are more detailed information of the respective items, downloads latest version software to be used in the fabrication apparatus from a software library presented by the vendor, and downloads operation guidance (help information) for the operator's reference. The maintenance information provided from the maintenance database includes the information on the above-described present invention, and the software library provides latest version software to realize the present invention.

Figure 24:
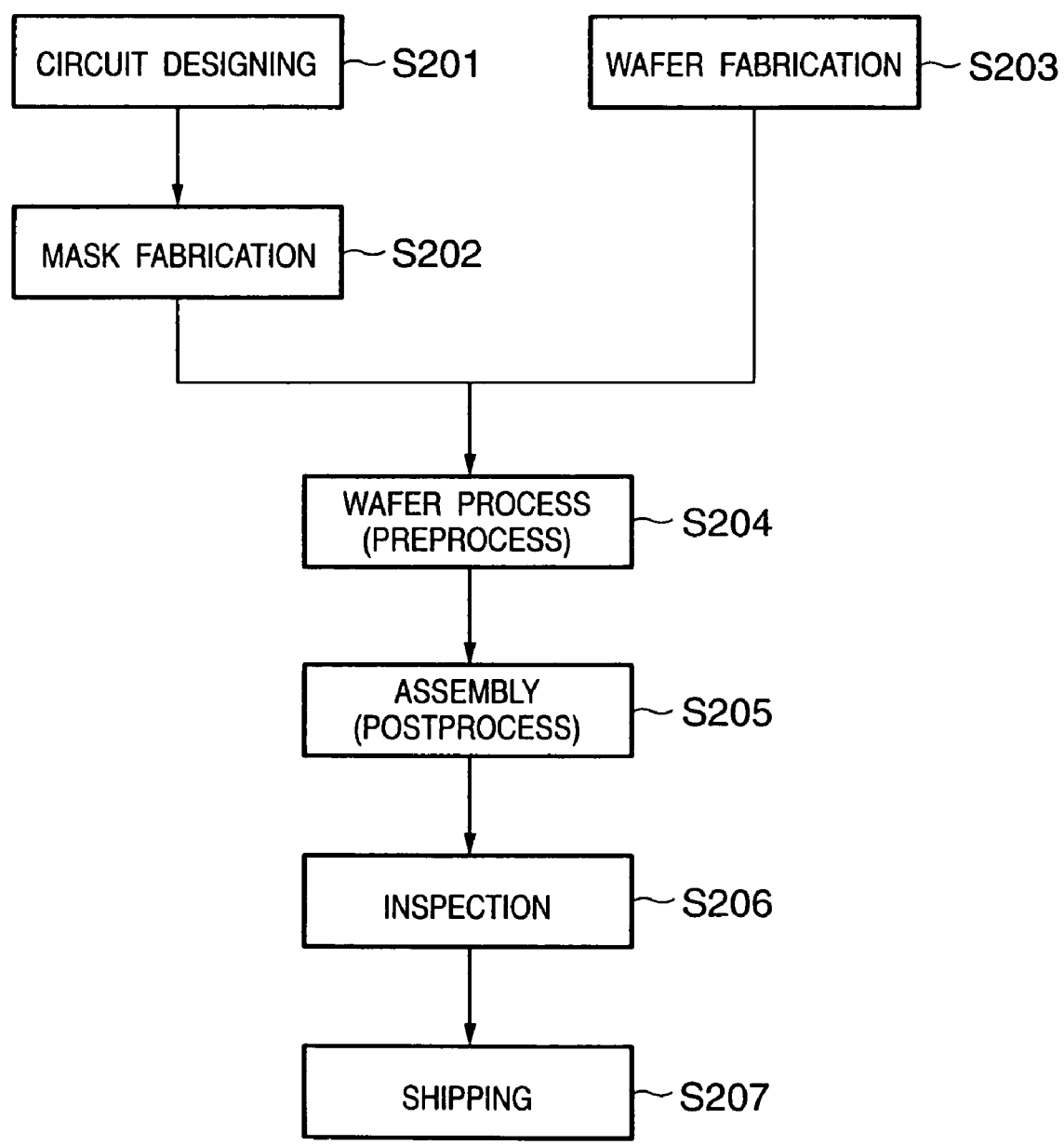
FIG. 24 is a flowchart showing a device fabrication process.

Next, a semiconductor device fabrication process utilizing the above-described production system will be described. FIG. 24 shows a flow of the entire semiconductor fabrication process. At step S201 (circuit designing), a circuit designing of the semiconductor device is performed. At step S202 (mask fabrication), a mask where the designed circuit pattern is formed is fabricated. On the other hand, at step S203 (wafer fabrication), a wafer is fabricated using silicon, or the like. At step S204 (wafer process), called a preprocess, the above mask and wafer are used. An actual circuit is formed on the wafer by lithography. At step S205 (assembly), called a postprocess, a semiconductor chip is formed by using the wafer at step S204. The postprocess includes processing such as an assembly process (dicing and bonding) and a packaging process (chip sealing). At step S206 (inspection), inspections such as an operation test and a durability test are performed on the semiconductor device assembled at step S205. The semiconductor device is completed through these processes, and it is shipped (step S207). The preprocess and the postprocess are independently performed in specialized factories, and maintenance is made for these factories by the above-described remote maintenance system. Further, data communication is performed for production management and/or apparatus maintenance between the preprocess factory and the postprocess factory via the Internet or private-line network.

Figure 25:
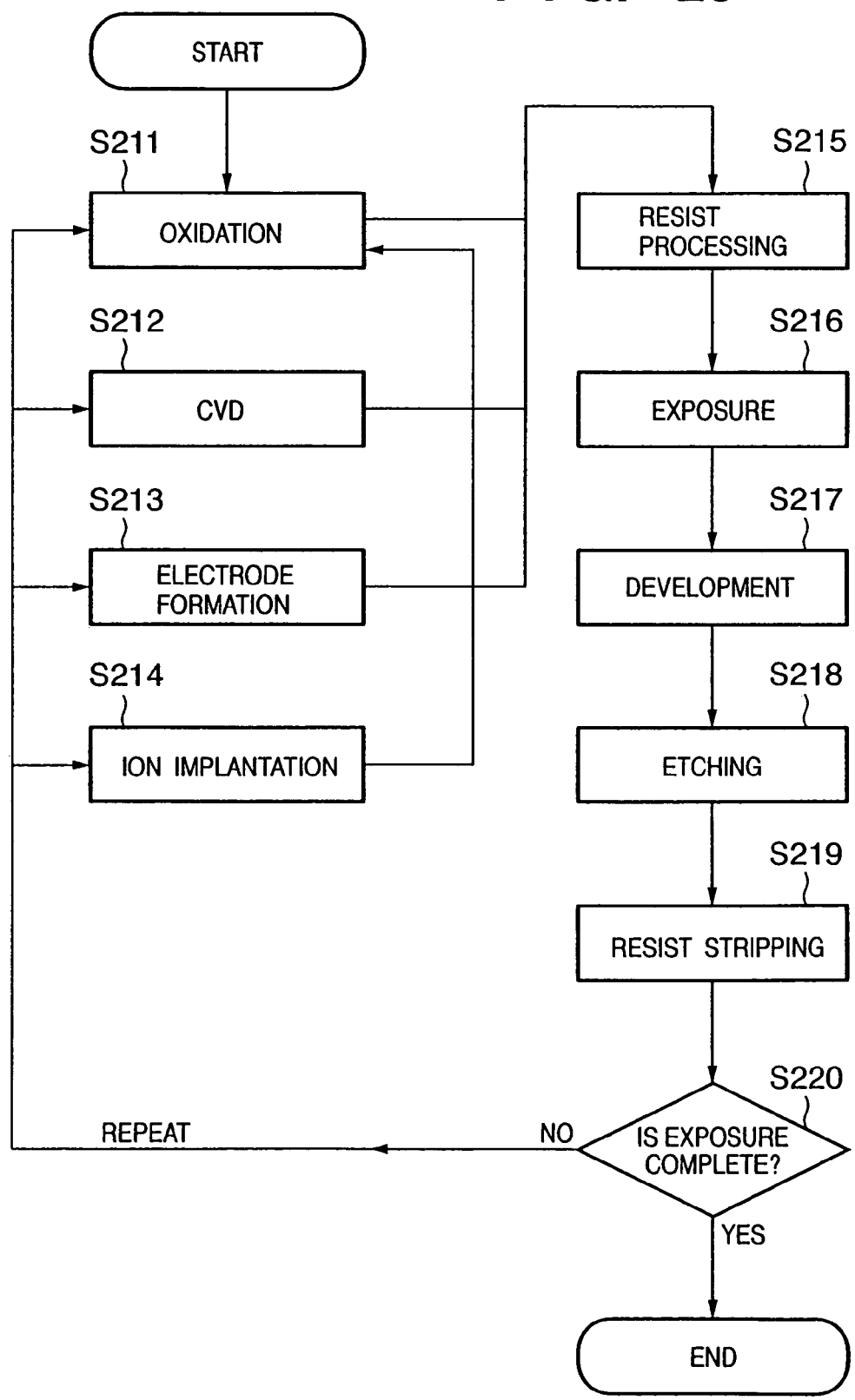
FIG. 25 is a flowchart showing a wafer process.

FIG. 25 shows a more detailed flow of the wafer process. At step S211 (oxidation), the surface of the wafer is oxidized. At step S212 (CVD), an insulating film is formed on the surface of the wafer. At step S213 (electrode formation), electrodes are formed by vapor deposition on the wafer. At step S214 (ion implantation), ions are injected into the wafer. At step S215 (resist processing), the wafer is coated with photoresist. At step S216 (exposure), the above-described exposure apparatus exposure-transfers the circuit patter of the mask onto the wafer. At step S217 (development), the exposed wafer is developed. At step S218 (etching), portions other than the resist image are etched. At step S219 (resist stripping), the resist unnecessary after the etching is removed. At step S220, it is judged whether an exposure is complete or not. If it is not complete, the flow returns to step S211, S212, S213 or S214. These steps are repeated, thereby multiple circuit patterns are formed on the wafer. As maintenance is performed on the fabrication apparatuses used in the respective steps by the above-described remote maintenance system, trouble is prevented, and even if it occurs, quick recovery can be made. In comparison with the conventional art, the productivity of the semiconductor device can be improved.

The present invention is not limited to the above embodiments and various changes and modifications can be made within the spirit and scope of the present invention. Therefore, to apprise the public of the scope of the following invention, the following claims are made.

What is claimed is:

1. A method of exposing an object to be exposed, said method comprising the steps of:
   (a) detecting a position of the object to be exposed by a position detection method of detecting a position of an object to be observed by a position detection system, said position detection method comprising the steps of:
      (i) obtaining detection signals of an alignment mark composed of a plurality of marks on the object a plurality of number of times, by the position detection system;
      (ii) respectively calculating a mark spacing between the plurality of marks from each of the detection signals obtained in the obtaining step;

(iii) evaluating measurement reproducibility of the position detection system on the basis of mark spacing information obtained from the calculating steps; and (iv) detecting the position of the object by the position detection system, of which the measurement reproducibility is evaluated;

(b) positioning the object on the basis of a detection result of the detecting step; and (c) exposing the positioned object.

2. The method according to claim 1, wherein the position detection method further comprises the step of selecting of an optimum illumination mode on the basis of the evaluation result of the measurement reproducibility, wherein, in the detecting step, the position of the object is detected by using the optimum illumination mode.

3. The method according to claim 1, wherein the position detection method further comprises the step of selecting of an optimum alignment mark on the basis of the evaluation result of the measurement reproducibility, wherein, in the detecting step, the position of the object is detected by using the optimum alignment mark.

4. A method of exposing an object to be exposed, said method comprising the steps of:

(a) detecting a position of the object to be exposed by a position detection method of detecting a position of an object to be observed by a position detection system, said position detection method comprising the steps of:

(i) obtaining, by the position detection system, a plurality of alignment marks, each of the alignment marks being composed of a plurality of marks on the object;

(ii) calculating a mark spacing between the plurality of marks of each alignment mark from each of the detection signals obtained in the obtaining step;

(iii) selecting a specific alignment mark from the plurality of alignment marks on the basis of mark spacing information obtained in the calculating step; and (iv) detecting the position of the object by using the specific alignment mark;

(b) positioning the object on the basis of a detection result of the detecting step; and (c) exposing the positioned object.

5. A method of exposing an object to be exposed, said method comprising the steps of:

(a) detecting a position of the object to be exposed by a position detection method of detecting a position of an object to be observed by a position detection system, said position detection method comprising the steps of:

(i) moving an alignment mark composed of a plurality of marks on the object relative to the position detection system in a measurement direction of the alignment mark;

(ii) measuring each mark spacing between the plurality of marks at a plurality of the relative positions;

(iii) calculating a variation amount of the mark spacing on the basis of mark spacing information obtained by the measuring step;

(iv) evaluating a measurement performance of the position detection system on the basis of the variation amount; and (iv) detecting the position of the object by the position detection system of which the measurement performance is evaluated;

(b) positioning the object on the basis of a detection result of the detecting step; and (c) exposing the positioned object.

6. The method according to claim 5, wherein the position detection method further comprises the step of selecting of an optimum illumination mode on the basis of the evaluation result of the measurement reproducibility, wherein, in the detecting step, the position of the object is detected by using the optimum illumination mode.

7. The method according to claim 5, wherein the position detection method further comprises the step of selecting of an optimum alignment mark on the basis of the evaluation result of the measurement reproducibility, wherein, in the detecting step, the position of the object is detected by using the optimum alignment mark.

* * * * *

UNITED STATES PATENT AND TRADEMARK OFFICE
CERTIFICATE OF CORRECTION

| | |
|---|---|
| PATENT NO. | : 7,230,706 B2 |
| APPLICATION NO. | : 11/102854 |
| DATED | : June 12, 2007 |
| INVENTOR(S) | : Kazuhiko Mishima |

It is certified that error appears in the above-identified patent and that said Letters Patent is hereby corrected as shown below:

COLUMN 1:
Line 35, "only has a" should read -- only as a --.

COLUMN 2:
Line 55, "on 6 the wafer" should read -- on the wafer --.

COLUMN 4:
Line 64, "respectively." should read -- respectively; --.

COLUMN 6:
Line 17, "plage" should read -- plate --.
Line 46, "comprises of" should read -- comprised of --.

COLUMN 7:
Line 59, "similarly evaluation" should read -- similar evaluation of --.

COLUMN 8:
Line 3, "ships" should read -- chips --.

COLUMN 10:
Line 33, "as selected," should read -- is selected, --.

COLUMN 12:
Line 48, "ration" should read -- ratio --.

COLUMN 13:
Line 32, "generated). On the other hand, in the" should read -- generated). -- and a new paragraph should begin with "On the other hand, in the".
Line 48, "mar spacing" should read -- mark spacing --.

COLUMN 14:
Line 30, "generated for" should read -- generated from --.
Line 45, "object to stop PL" should read -- object stop PL --.

COLUMN 17:
Line 54, "are more" should read -- provide more --.

UNITED STATES PATENT AND TRADEMARK OFFICE
CERTIFICATE OF CORRECTION

PATENT NO. : 7,230,706 B2
APPLICATION NO. : 11/102854
DATED : June 12, 2007
INVENTOR(S) : Kazuhiko Mishima It is certified that error appears in the above-identified patent and that said Letters Patent is hereby corrected as shown below:

<u>COLUMN 18:</u>
Line 32, "patter" should read -- pattern --.

Signed and Sealed this

Twenty-fifth Day of December, 2007

JON W. DUDAS
*Director of the United States Patent and Trademark Office*